United States Patent
Takeya et al.

(10) Patent No.: US 12,198,828 B2
(45) Date of Patent: Jan. 14, 2025

(54) ELECTRICALLY CONDUCTIVE POLYMER MATERIAL AND METHOD FOR PRODUCING SAME, POLYMER FILM AND METHOD FOR PRODUCING SAME, ELECTRICALLY CONDUCTIVE POLYMER FILM, PHOTOELECTRIC CONVERSION ELEMENT, AND FIELD EFFECT TRANSISTOR

(71) Applicant: The University of Tokyo, Tokyo (JP)

(72) Inventors: Junichi Takeya, Tokyo (JP); Shunichiro Watanabe, Tokyo (JP); Yu Yamashita, Tokyo (JP)

(73) Assignee: The University of Tokyo, Tokyo (JP)

( * ) Notice: Subject to any disclaimer, the term of this patent is extended or adjusted under 35 U.S.C. 154(b) by 774 days.

(21) Appl. No.: 17/286,983

(22) PCT Filed: Oct. 21, 2019

(86) PCT No.: PCT/JP2019/041411
§ 371 (c)(1),
(2) Date: Jun. 24, 2021

(87) PCT Pub. No.: WO2020/085342
PCT Pub. Date: Apr. 30, 2020

(65) Prior Publication Data
US 2021/0383943 A1    Dec. 9, 2021

(30) Foreign Application Priority Data

Oct. 22, 2018 (JP) ................................. 2018-198794

(51) Int. Cl.
*H01B 1/12* (2006.01)
*C08J 7/02* (2006.01)
(Continued)

(52) U.S. Cl.
CPC ................ *H01B 1/124* (2013.01); *C08J 7/02* (2013.01); *H01L 29/786* (2013.01); *H01L 33/50* (2013.01); *H10N 10/856* (2023.02)

(58) Field of Classification Search
CPC ......... C08J 7/02; C08J 2300/12; H01B 1/124; H01N 10/856; H01L 29/786; H01L 33/50
See application file for complete search history.

(56) References Cited

U.S. PATENT DOCUMENTS 5,217,650 A * 6/1993 Theophilou .............. B29D 7/01
                                                    264/235.6
2012/0266960 A1* 10/2012 Fan ........................ H10K 30/82
                                                    257/E51.026

FOREIGN PATENT DOCUMENTS

JP        H101187706 A      7/1989
JP        H0243216 A        2/1990
(Continued)

OTHER PUBLICATIONS

Yamashita, Efficient molecular doping of polymeric semiconductors driven by anion exchange, 2019, Nature, vol. 572, pp. 634-638. (Year: 2019).*

(Continued)

*Primary Examiner* — Monique R Jackson
(74) *Attorney, Agent, or Firm* — Fox Rothschild LLP; Carol Thorstad-Forsyth

(57) ABSTRACT

The method for producing an electrically conductive polymer material includes: a preparing step of providing a polymer film formed from an oriented polymeric semiconductor; and a doping step of introducing a first ion into the polymer film, in the doping step, a treatment liquid, which is obtained by dissolving, in an ionic liquid including the first ion having the opposite polarity to carriers to be injected into the polymeric semiconductor by doping in the form of a cation and an anion or an organic solvent having dissolved (Continued)

therein a salt including the first ion, a dopant which has the same polarity as that of the first ion and which oxidizes or reduces the polymeric semiconductor, is allowed to be in contact with the surface of the polymer film to form an intermediate of a second ion formed by ionization of the dopant and the polymeric semiconductor by a redox reaction, and to replace the second ion in the intermediate with the first ion.

4 Claims, 25 Drawing Sheets

(51) Int. Cl.
  *H01L 29/786* (2006.01)
  *H01L 33/50* (2010.01)
  *H10N 10/856* (2023.01)

(56) References Cited

FOREIGN PATENT DOCUMENTS

| | | | |
|---|---|---|---|
| JP | 2001326393 | A | 11/2001 |
| JP | 2007314750 | A | 12/2007 |
| JP | 2008226959 | A | 9/2008 |
| JP | 2009011103 | A * | 1/2009 |
| JP | 2013506278 | A | 2/2013 |
| JP | 2017137365 | A | 8/2017 |
| WO | 2017108882 | A1 | 6/2017 |

OTHER PUBLICATIONS

Yamashita, Improved efficiency of molecular doping in polymeric semiconductors via anion exchange, 2018, MRS Spring Meeting 2018, Apr. 3, 2018, Phoenix AZ (Abstract only, document previously submitted by Applicant). (Year: 2018).*
Yamashita, Improved efficiency of molecular doping in polymeric semiconductors via anion exchange, 2018, E-MRS Spring Meeting 2018, Symposium H, Jun. 20, 2018, Strasbourg France (Abstract only, document previously submitted by Applicant). (Year: 2018).*
Machine translation of JP2009-011103A, published Jan. 2009, Powered by EPO and Google. (Year: 2009).*
Machine translation of JPH02-43216A, published 1990, Powered by EPO and Google. (Year: 1990).*
Machine translation of JPH01-187706A, published 1989, Powered by EPO and Google. (Year: 1989).*
Yamashita, Mobility Exceeding 10 cm2/(V.s) in Donor-Acceptor Polymer Transistors with Band-like Charge Transport, 2015, Chemistry of Materials, 2016, vol. 28, pp. 420-424. (Year: 2016).*
Soeda, Highly Oriented Polymer Semiconductor Films Compressed at the Surface of Ionic Liquids for High-Performance Polymeric Organic Field-Effect Transistors, 2014, Advanced Materials, vol. 26, pp. 6430-6435. (Year: 2014).*
Yevhen Karpov et al. "Molecular Doping of a High Mobility Diketopyrrolopyrrole-Dithienylthieno[3,2-b]thiophene Donor-Acceptor Copolymer with F6TCNNQ" Macromolecules, 2017, 50 (3), pp. 914-926.
Japanese Patent Application No. 2018-198794 as filed with the Japanese Patent Office on Oct. 22, 2018, with English language translation (100 pages).

* cited by examiner

ELECTRICALLY CONDUCTIVE POLYMER MATERIAL AND METHOD FOR PRODUCING SAME, POLYMER FILM AND METHOD FOR PRODUCING SAME, ELECTRICALLY CONDUCTIVE POLYMER FILM, PHOTOELECTRIC CONVERSION ELEMENT, AND FIELD EFFECT TRANSISTOR

CROSS REFERENCE TO RELATED APPLICATION

The present application is the U.S. National Phase of International Patent Application No. PCT/JP2019/041411 filed on Oct. 21, 2019, which claims priority to Japanese Patent Application No. 2018-198794 filed on Oct. 22, 2018. All of the aforementioned applications are incorporated herein by reference in their entireties.

TECHNICAL FIELD

The present invention relates to an electrically conductive polymer material and a method for producing the same, a polymer film and a method for producing the same, an electrically conductive polymer film, a photoelectric conversion element, and a field effect transistor.

BACKGROUND ART

Various types of semiconductor elements using an electrically conductive polymer material (conductive polymer material) produced from a polymer compound having semiconducting properties (hereinafter, referred to as "polymeric semiconductor") have been proposed. For example, with respect to a thermoelectric conversion element, in order to increase the thermoelectric conversion efficiency, an electrically conductive polymer material having an improved electrical conductivity is used, wherein the electrically conductive polymer material is obtained by doping a polymer film formed from a polymeric semiconductor. As a method for doping, there has been known, for example, a method in which an electrically conductive polymer material is formed using a mixed solution having dissolved therein a polymeric semiconductor and a dopant (see, for example, NPL 1).

CITATION LIST

Non Patent Literature

NPL 1: Yevhen Karpov et al. "Molecular Doping of a High Mobility Diketopyrrolopyrrole-Dithienylthieno[3,2-b]thiophene Donor-Acceptor Copolymer with F6TCNNQ" Macromolecules", 2017, 50 (3), pp 914-926

SUMMARY OF THE INVENTION

Technical Problem

When an electrically conductive polymer material is formed by the above-mentioned method using a mixed solution, problems arise in that, for example, a satisfactory doping amount cannot be achieved, and that when the doping amount is increased, orientation of the polymeric semiconductor in the resultant electrically conductive polymer material is disordered. For this reason, further improvement of the electrically conductive polymer material in electrically conductivity has been desired.

In view of the above, the present invention has been made, and an object of the invention is to provide an electrically conductive polymer material having improved electrical conductivity and a method for producing the same, a polymer film and a method for producing the same, an electrically conductive polymer film, a photoelectric conversion element, and a field effect transistor.

Solution to Problem

The method for producing an electrically conductive polymer material of the present invention includes: a preparing step of providing a polymer film formed from an oriented polymeric semiconductor; and a doping step of introducing a first ion into the polymer film, in the doping step, a treatment liquid, which is obtained by dissolving, in an ionic liquid including the first ion having the opposite polarity to carriers to be injected into the polymeric semiconductor by doping in the form of a cation and an anion or an organic solvent having dissolved therein a salt including the first ion, a dopant which has the same polarity as that of the first ion and which oxidizes or reduces the polymeric semiconductor, is allowed to be in contact with the surface of the polymer film to form an intermediate of a second ion formed by ionization of the dopant and the polymeric semiconductor by a redox reaction, and to replace the second ion in the intermediate with the first ion.

The method for producing an electrically conductive polymer material of the present invention includes: a preparing step of providing a polymer film formed from an oriented polymeric semiconductor; and a doping step of allowing a treatment liquid having a dopant dissolved in an organic solvent to be in contact with the polymer film to introduce the dopant into the polymer film.

The method for producing a polymer film of the present invention includes: a supplying step of supplying a solution having a polymeric semiconductor dissolved in a solvent onto the surface of a flat substrate; and a pressing step of pressing the solution on the substrate by a flat plane into a film form, and evaporating the solvent in the solution in the state of being pressed, thereby obtaining a polymer film formed from the polymeric semiconductor.

The electrically conductive polymer material of the present invention includes a polymer film formed from polymeric semiconductors which are oriented and in the form of a plurality of layers stacked on one another, and a dopant distributed in the polymer film in the direction of the stacked layers of the polymeric semiconductors, wherein the number of the dopant contained in each of the polymeric semiconductors is in the range of from 1/3 to 2 per one space between a pair of side chains adjacent to each other in the orientation direction of the polymeric semiconductors.

The electrically conductive polymer film of the present invention includes a polymer film formed from a P type polymeric semiconductor, and a dopant distributed in the polymer film, wherein the conductive polymer film has a work function of 5.5 eV or more.

The polymer film of the present invention comprises an oriented polymeric semiconductor, and has a thickness in the range of from at least 10 μm to 50 μm.

The field effect transistor of the present invention includes: an insulating layer; a gate electrode formed on one surface of the insulating layer; a semiconductor layer having semiconducting properties and being formed on another surface of the insulating layer; a source electrode; and a drain electrode, wherein each of the source electrode and the drain electrode has an electrically conductive polymer layer containing a dopant therein and being formed from a polymeric semiconductor, wherein the electrically conductive polymer layer is formed in close contact with the semiconductor layer.

The photoelectric conversion element of the present invention includes: a photoelectric conversion layer; and a buffer layer group including one or a plurality of buffer layers for energy level matching at the interface between the photoelectric conversion layer and an electrode, wherein the buffer layer group has one buffer layer which is stacked on the photoelectric conversion layer directly or through another buffer layer, and which is composed of an electrically conductive polymer film containing a dopant therein and being formed from a polymeric semiconductor.

Advantageous Effects of Invention

By the method for producing an electrically conductive polymer material of the present invention, a satisfactory doping amount in the electrically conductive polymer material can be achieved without disordering the orientation of the electrically conductive polymer, making it possible to improve the electrical conductivity.

By the method for producing a polymer film of the present invention, a polymer film having a large and uniform thickness can be formed, achieving an improvement of the electrical conductivity.

The electrically conductive polymer material of the present invention is advantageous in that the electrically conductive polymer material is doped uniformly in a satisfactory doping amount, achieving an improvement of the electrical conductivity.

With respect to the electrically conductive polymer film of the present invention, the electrically conductive polymer film of a P type is increased in work function, and the electrically conductive polymer film of an N type is reduced in work function. Therefore, carriers can be efficiently injected into and stored in the conductor and semiconductor material with which the electrically conductive polymer film is in contact. Moreover, injection of carriers into a material which is unlikely to be doped and local injection of carriers can be easily made.

The polymer film of the present invention is advantageous in that the polymeric semiconductor is oriented and that the polymer film has a large thickness, achieving an improvement of the electrical conductivity.

In the field effect transistor of the present invention, the electrically conductive polymer film containing a dopant therein is in close contact with the semiconductor layer, and therefore carriers are injected into and stored in the semiconductor layer from the electrically conductive polymer film, so that no doping of the semiconductor layer is needed.

In the photoelectric conversion element of the present invention, the electrically conductive polymer film containing a dopant therein is used as a buffer layer, and therefore injection of carriers into the photoelectric conversion layer and collection of carriers from the photoelectric conversion layer can be efficiently conducted.

DESCRIPTION OF EMBODIMENTS

First Embodiment

Figure 1:
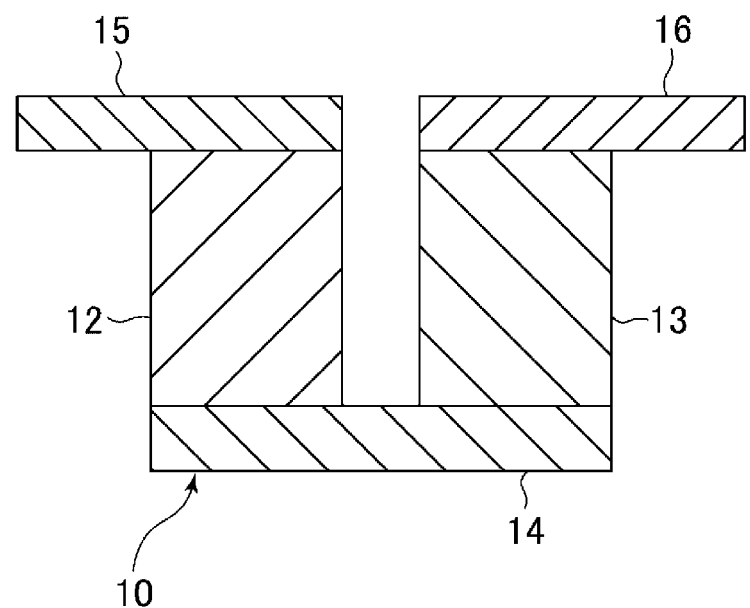
FIG. 1 A cross-sectional view showing a thermoelectric conversion element according to a first embodiment.

A thermoelectric conversion element 10 shown in FIG. 1 comprises conductive polymer films 12, 13 which are a conductive polymer material, and electrodes 14 to 16. The conductive polymer films 12, 13 function as a thermoelectric conversion portion for the thermoelectric conversion element 10, and the conductive polymer film 12 is a P type semiconductor and the conductive polymer film 13 is an N type semiconductor. The electrode 14 is provided as a common electrode at one end of the conductive polymer films 12, 13. The electrode 15 is provided at another end of the conductive polymer film 12, and the electrode 16 is provided at another end of the conductive polymer film 13. The thermoelectric conversion element 10 generates electromotive force due to a temperature difference between the electrode 14 and the electrodes 15, 16, and the generated electromotive force is taken out of the element through the electrodes 15, 16 to the outside.

The conductive polymer material forming the conductive polymer films 12, 13 is a polymer film which is doped, and which is formed in a film form from a polymer compound having semiconducting properties (hereinafter, referred to as "polymeric semiconductor") in the oriented state.

Hereinbelow, the method for producing the conductive polymer material forming the conductive polymer films 12, 13 will be described. The conductive polymer material is produced through the steps of forming a polymer film from a polymeric semiconductor (film formation step), and doping the polymer film (doping step).

[Film Formation Step]

Figure 2:
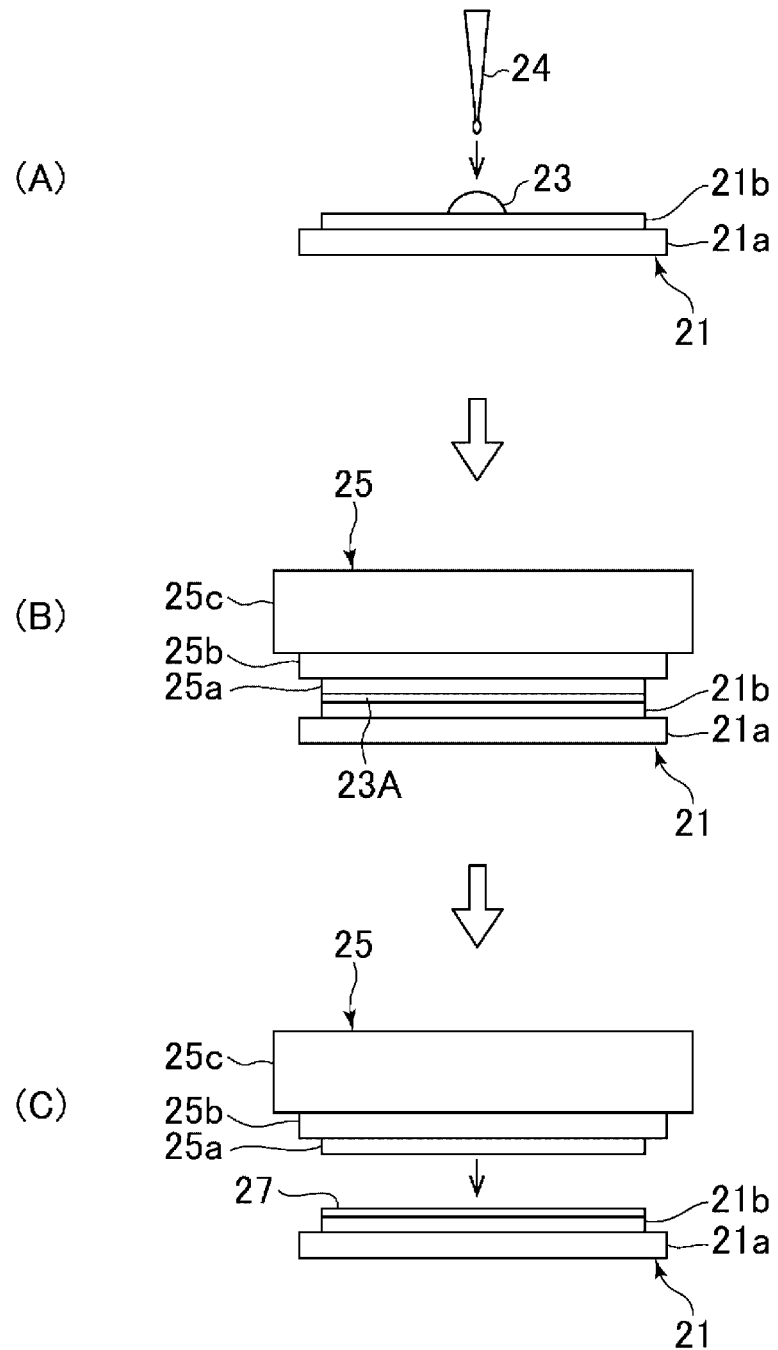
FIG. 2 Explanatory views showing the procedure for producing a polymer film.

The film formation step is described with reference to FIG. 2. In the film formation step, a substrate 21 having a flat upper surface is first provided. The substrate 21 has a substrate body 21*a* made of, for example, polyimide having high stiffness, and a PDMS layer 21*b* formed from dimethylpolysiloxane (PDMS) formed on the surface of the substrate body 21*a*. The PDMS layer 21*b* is provided for facilitating peeling of the polymer film, and the PDMS layer 21*b* has the upper surface flattened.

As shown in FIG. 2(A), a solution 23 in a predetermined amount is supplied to the upper surface of the PDMS layer 21b from a supply pipe 24. The solution 23 has dissolved in a solvent a polymeric semiconductor for forming a polymer film. In the case of obtaining a conductive polymer material which is a P type semiconductor, the solution 23 having a P type polymeric semiconductor dissolved in a solvent is used, and, in the case of obtaining a conductive polymer material which is an N type semiconductor, the solution 23 having an N type polymeric semiconductor dissolved in a solvent is used. As the P type polymeric semiconductor, one which is obtained by polymerization or copolymerization of thiophene, thiadiazole, diketopyrrolopyrrole, or the like can be used. As the N type polymeric semiconductor, one which is obtained by polymerization or copolymerization of naphthalenediimide, perylenediimide, thiophene, or the like can be used. As a solvent for the solution 23, acetonitrile, butyl acetate, fluoroalcohol, or the like can be used.

The concentration of the solution 23 (=(Mass of the polymeric semiconductor)/(Mass of the polymeric semiconductor+Mass of the solvent)×100(%)) is preferably in the range of from 0.1 to 10% by weight, more preferably in the range of from 1.5 to 10% by weight. When the concentration of the solution 23 is 0.1% by weight or more, a polymer film having a uniform thickness can be surely formed, and, when the concentration of the solution 23 is 10% by weight or less, the solution 23 can be easily prepared without causing the solution to suffer coagulation. Further, when the concentration of the solution 23 is 1.5% by weight or more, a polymer film having a thickness as large as 1 µm or more can be surely formed.

After supplying the solution 23, as shown in FIG. 2(B), a press member 25 is placed on the solution 23 on the substrate 21. The press member 25 has a PDMS layer 25a, an upper plate 25b having the PDMS layer 25a formed on the lower surface thereof, and a weight 25c placed on the upper surface of the upper plate 25b. The PDMS layer 25a has the lower surface flattened. Like the PDMS layer 21b, the PDMS layer 25a is provided for facilitating peeling of the polymer film.

By placing the press member 25 on the solution 23 on the substrate 21 as mentioned above, the solution 23 is developed over the PDMS layer 21b, forming a solution film 23A. When an appropriate amount of the solution 23 is applied onto the substrate 21, the solution 23 does not leak from the outer edge of the gap between the PDMS layer 21b and the PDMS layer 25a. Even when too large an amount of the solution 23 is applied onto the substrate 21, the excess solution 23 is discharged to the outside, surely achieving the reproducibility of the thickness of the polymer film formed. A load is vertically and uniformly applied to the solution film 23A by the press member 25. The state in which a load is applied to the solution film is maintained until the solvent in the solution film 23A is evaporated. The load applied by the press member 25 to the solution film 23A per unit area is preferably in the range of from 0.1 to 10 g/cm². When the load is 0.1 g/cm² or more, the solution 23 can be easily developed, and, when the load is about 10 g/cm² or less, the thickness of the polymer film formed can be easily controlled while rendering the thickness uniform by increasing or decreasing the load.

The solvent in the solution film 23A is evaporated, so that a polymer film 27 is formed between the PDMS layer 21b and the PDMS layer 25a. Subsequently, as shown in FIG. 2(C), the polymer film 27 is peeled off from the PDMS layer 25a. When obtaining the polymer film 27 in an isolated form, the polymer film 27 is further peeled off from the PDMS layer 21b, but, when subjecting the polymer film 27 to doping treatment or the like, the polymer film 27 which has been subjected to such a treatment may be peeled off from the PDMS layer 21b.

The polymer film 27 formed by the above-mentioned method has a uniform thickness without suffering a coffee ring effect (phenomenon) such that the middle portion of the film is thin and the periphery portion has an increased thickness. Further, the above-mentioned method enables formation of the polymer film 27 having a thickness of 500 nm or more, and thus the polymer film 27 having a thickness which is not only uniform but also as large as at least 10 µm to 50 µm can be easily formed. The increase of the thickness of the polymer film 27 advantageously improves the conductivity of the conductive polymer material. The formed polymer film 27 and a conductive polymer film obtained by doping the polymer film 27 can be used as a free-standing film due to the thickness thereof.

The thickness of the polymer film 27 can be controlled by appropriately changing the concentration of the solution 23 and the load. Specifically, the thickness of the polymer film can be reduced by reducing the concentration of the solution 23 or increasing the load, and the thickness of the polymer film can be increased by increasing the concentration of the solution 23 or reducing the load.

Figure 3:
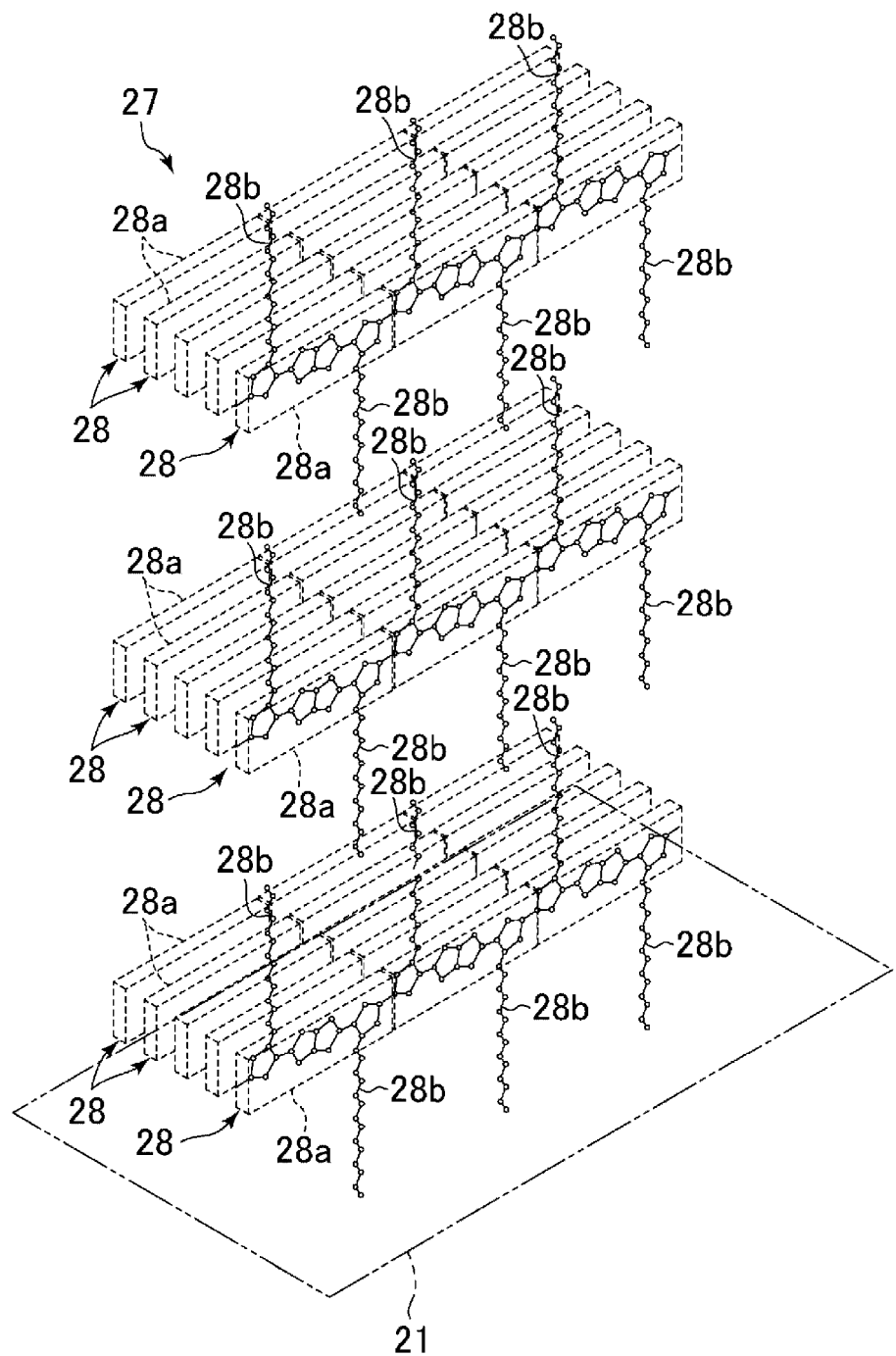
FIG. 3 An explanatory view showing the state of the oriented conductive polymer in the polymer film.

As diagrammatically shown in FIG. 3, in the polymer film 27 formed as mentioned above, each polymeric semiconductor 28 constituting the polymer film is, for example, edge-on oriented. Specifically, in the polymeric semiconductor 28, the plane of main chain is perpendicular to the substrate 21, and the polymeric semiconductors 28 are in the form of a plurality of layers stacked on one another in a state such that main chains 28a extend in the same direction. Side chains 28b of the polymeric semiconductor 28 extend from the main chain 28a in the thicknesswise direction of the polymer film 27. The structure of the polymeric semiconductor 28 shown in FIG. 3 is drawn for convenience sake, and symbol "0" in the drawing indicates atoms of carbon, nitrogen, and the like. Further, in FIG. 3, for avoiding complication, the side chains 28b are drawn only for the front polymeric semiconductor 28 seen in the drawing, but the other polymeric semiconductors 28 similarly have side chains.

[Doping Step]

The doping step using a method for doping the polymer film 27 utilizing a redox reaction (hereinafter, referred to as "redox method") is first described. In the redox method, the polymer film is allowed to be in contact with a solution having a dopant dissolved in an organic solvent, introducing the dopant into the polymer film 27.

Figure 4:
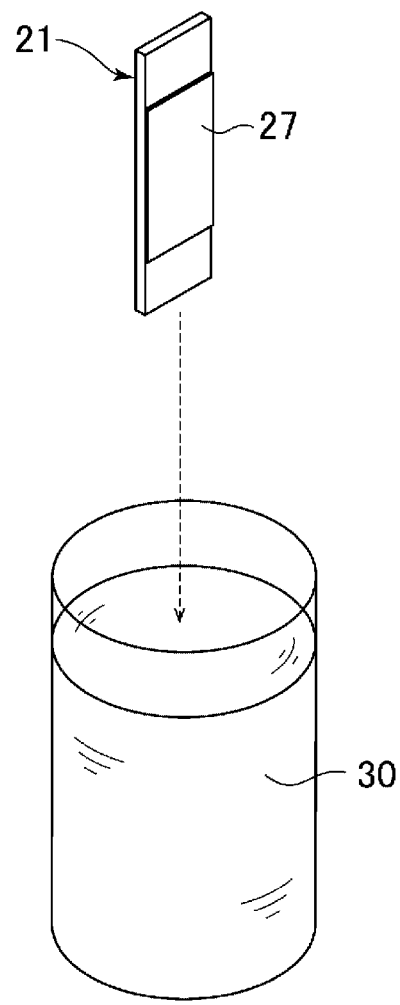
FIG. 4 An explanatory view showing an example of doping by oxidation and reduction.

As shown in FIG. 4, the polymer film 27 which is to be doped is, for example, immersed in a treatment liquid 30. The treatment liquid 30 is obtained by dissolving or dispersing the dopant described below in detail in an organic solvent, and the treatment liquid 30 does not have a polymeric semiconductor dissolved. When the dopant (molecules) in the treatment liquid 30 is in contact with the surface of the polymer film 27, the polymeric semiconductor 28 constituting the polymer film 27 and the dopant undergo a redox reaction. Instead of immersing the polymer film 27 in the treatment liquid 30, the treatment liquid 30 may be applied, dropwise added, or developed to the surface of the polymer film 27.

Figure 5:
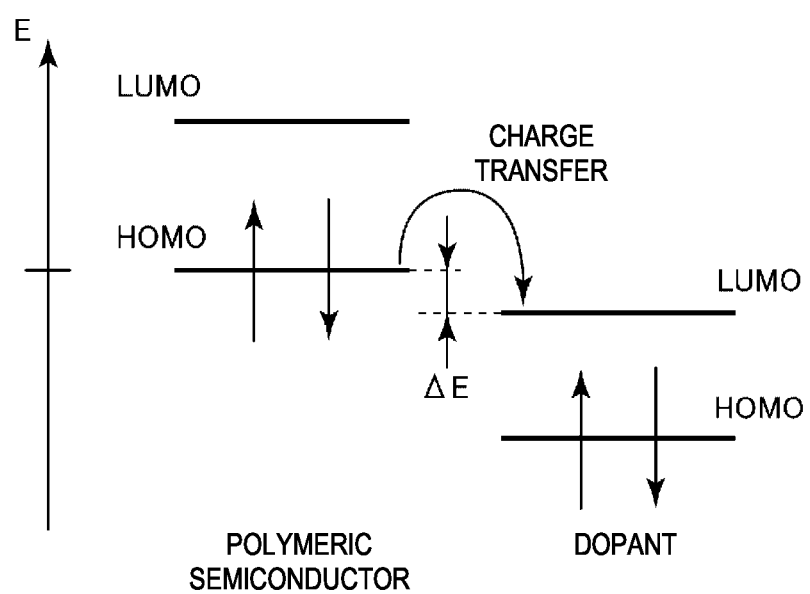
FIG. 5 An explanatory view showing the relationship between the HOMO of a polymeric semiconductor and the LUMO of a dopant.

For example, in the case of doping the P type polymeric semiconductor 28, as shown in FIG. 5, charge transfer occurs between the HOMO (Highest Occupied Molecular Orbital) of the polymeric semiconductor 28 and the LUMO (Lowest Unoccupied Molecular Orbital) of the dopant, that is, holes transfer to the polymeric semiconductor 28, so that carriers are injected into the polymeric semiconductor 28. In the case of doping the N type polymeric semiconductor 28, charge transfer occurs between the LUMO of the polymeric semiconductor 28 and the HOMO of the dopant, that is, electrons transfer to the polymeric semiconductor 28, so that carriers are injected into the polymeric semiconductor 28.

As apparent from the above description, when the polymeric semiconductor 28 is of a P type, a dopant capable of oxidizing the polymeric semiconductor is used. With respect to the dopant, preferred is one which satisfies the following relationship that: the energy level ($E_{LUMO}$) of the LUMO of the dopant, based on the vacuum level, is a value which is larger than the energy level ($E_{HOMO}$) of the HOMO of the polymeric semiconductor, based on the vacuum level, by about 0.3 eV ($E_{HOMO}$+0.3) or less ($E_{LUMO} \leq E_{HOMO}$+0.3), and more preferred is one which satisfies the relationship: "$E_{LUMO} \leq E_{HOMO}$".

When the polymeric semiconductor is of an N type, a dopant capable of reducing the polymeric semiconductor is used. With respect to the dopant, preferred is one which satisfies the following relationship that: the energy level ($E'_{HOMO}$) of the HOMO of the dopant, based on the vacuum level, is a value which is lower than the energy level ($E'_{LUMO}$) of the LUMO of the polymeric semiconductor, based on the vacuum level, by about 0.3 eV ($E'_{LUMO}$−0.3) or more ($E'_{HOMO} \geq E'_{LUMO}$−0.3), and more preferred is one which satisfies the relationship: "$E'_{HOMO} \geq E'_{LUMO}$".

Specific examples of dopants for P type polymeric semiconductor include 2,3,5,6-tetrafluoro-7,7,8,8-tetracyanoquinodimethane (F₄TCNQ, CAS No. (29261-33-4)), 1,3,4,5,7,8-hexafluorotetracyanonaphthoquinodimethane (F6TCNNQ), 2,3-dichloro-5,6-dicyano-p-benzoquinone (DDQ), and molybdenum tris(1-(trifluoroacetyl)-2-(trifluoromethyl)-ethane-1,2-dithiolene (Mo(tfd-COCF₃)). Specific examples of dopants for N type polymeric semiconductor include bis(cyclopentadienyl)cobalt, mesitylenepentamethylcyclopentadienylruthenium dimer, and 1,3-dimethyl-2-phenyl-2,3-dihydro-1H-benzimidazole. As an organic solvent for the treatment liquid 30, one which is capable of dissolving or dispersing the dopant is used, and, for example, acetonitrile, dimethyl sulfoxide, butyl acetate, an alkane solvent, fluoroalcohol, or perfluorotributylamine can be used.

Figure 6:
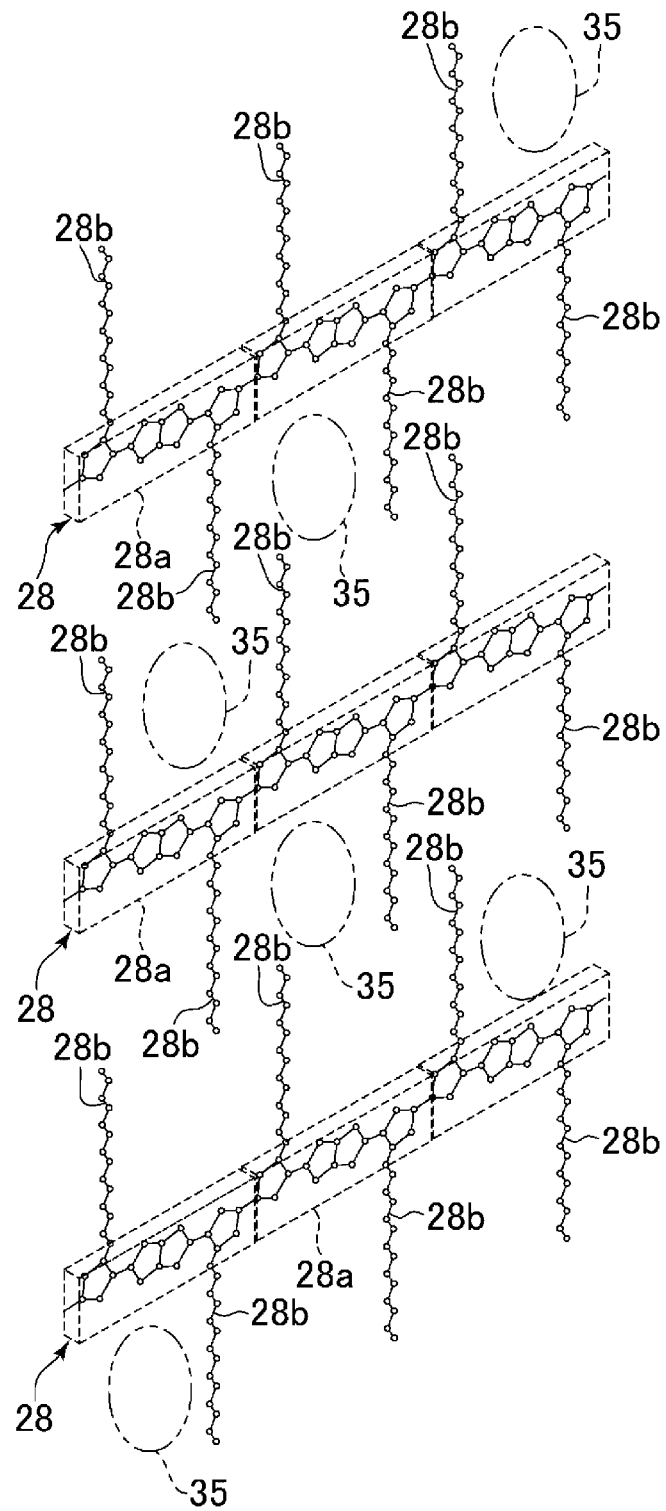
FIG. 6 An explanatory view showing the state of the dopant introduced into the polymer film by oxidation and reduction.

As diagrammatically shown in FIG. 6, a dopant 35 which has oxidized or reduced the polymeric semiconductor 28 as mentioned above is in the state of being introduced into the space between a pair of side chains adjacent to each other in the direction along which the polymeric semiconductor 28 extends, but the dopant moves in the in-plane direction and the thicknesswise direction of the polymer film 27 due to a solvation phenomenon, thermal diffusion, and electrostatic interaction. As a result, the dopant 35 is introduced into not only the surface of the polymer film 27 but also the inside of the polymer film 27, obtaining a conductive polymer material having the polymer film 27 doped uniformly in the in-plane direction and the thicknesswise direction.

By employing the doping by a redox method, with respect to the polymer film 27 having a thickness of 10 μm or less, the polymer film can be surely doped uniformly in the thicknesswise direction of the polymer film. Further, doping can be made in such an increased doping amount that the number of the dopant 35 contained in each of the polymeric semiconductors 28 is ⅓ or more per one space between a pair of side chains 28b adjacent to each other in the orientation direction of the polymeric semiconductors 28 (the direction along which the main chain 28a extends). That is, the doping amount can be increased to an extent of doping that one dopant 35 is disposed per three spaces each defined between a pair of side chains 28b.

The method for doping using ion exchange (hereinafter, referred to as "ion exchange method") is described below. In doping by an ion exchange method, the polymeric semiconductor in the polymer film 27 and a dopant (hereinafter, referred to as "initiator dopant") form an intermediate, and ion exchange causes the ionized initiator dopant to be replaced by another ion (hereinafter, referred to as "alternative ion"), forming a charge transfer complex of the polymeric semiconductor in the polymer film 27 and the alternative ion. In doping by this method, not only uniform doping but also efficient and effective doping can be achieved, making it possible to further increase the doping amount.

When the polymeric semiconductor in the polymer film 27 is taken as "A", the initiator dopant is taken as "B", a chemical species which forms an ion capable of forming a salt, together with the alternative ion, (hereinafter, referred to as "spectator ion") is taken as "C", and a chemical species which forms an alternative ion is taken as "D", doping by an ion exchange method can be represented by the following formula (1) in the case where the polymeric semiconductor is of a P type, and can be represented by the following formula (2) in the case where the polymeric semiconductor is of an N type.

[Math. 1]

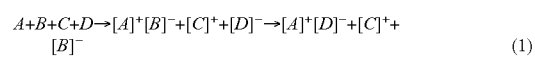

(1)

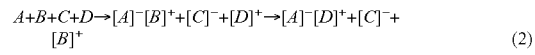

(2)

In doping by an ion exchange method, a treatment liquid 40 (see FIG. 7) is prepared by dissolving, in an ionic liquid which is a liquid of a salt composed of a spectator ion and an alternative ion, an initiator dopant having the same polarity (anion or cation) as that of the alternative ion. The salt composed of a spectator ion and an alternative ion need not be in a liquid state by itself, and may be dissolved in an organic solvent, such as acetonitrile or butyl acetate. The polymer film 27 is immersed in the treatment liquid 40 for a predetermined period of time, and then the substrate 21 is removed from the treatment liquid 40, and the surface of the substrate is dried by air blow or the like. As a result, the alternative ion is introduced into the inside of the polymer film 27, obtaining a conductive polymer material having the polymer film 27 doped.

As described below, in doping by an ion exchange method, irrespective of the thickness (irrespective of the depth in the surface), the alternative ion can be introduced into the all region of the polymer film 27 in the thicknesswise direction thereof, and therefore there is no problem even when one surface of the polymer film 27 is covered with the substrate 21.

The alternative ion is a first ion, and has the opposite polarity to carriers to be injected into the polymeric semiconductor by doping. The initiator dopant is a dopant which is ionized by a redox reaction with the organic semiconductor to form a second ion. When doping is conducted by an ion exchange method, for example, the treatment liquid 40 may be applied, dropwise added, or developed to the surface of the polymer film 27 as long as a reaction can be caused as mentioned above by allowing the treatment liquid 40 to be in contact with the surface of the polymer film 27.

Figure 7:
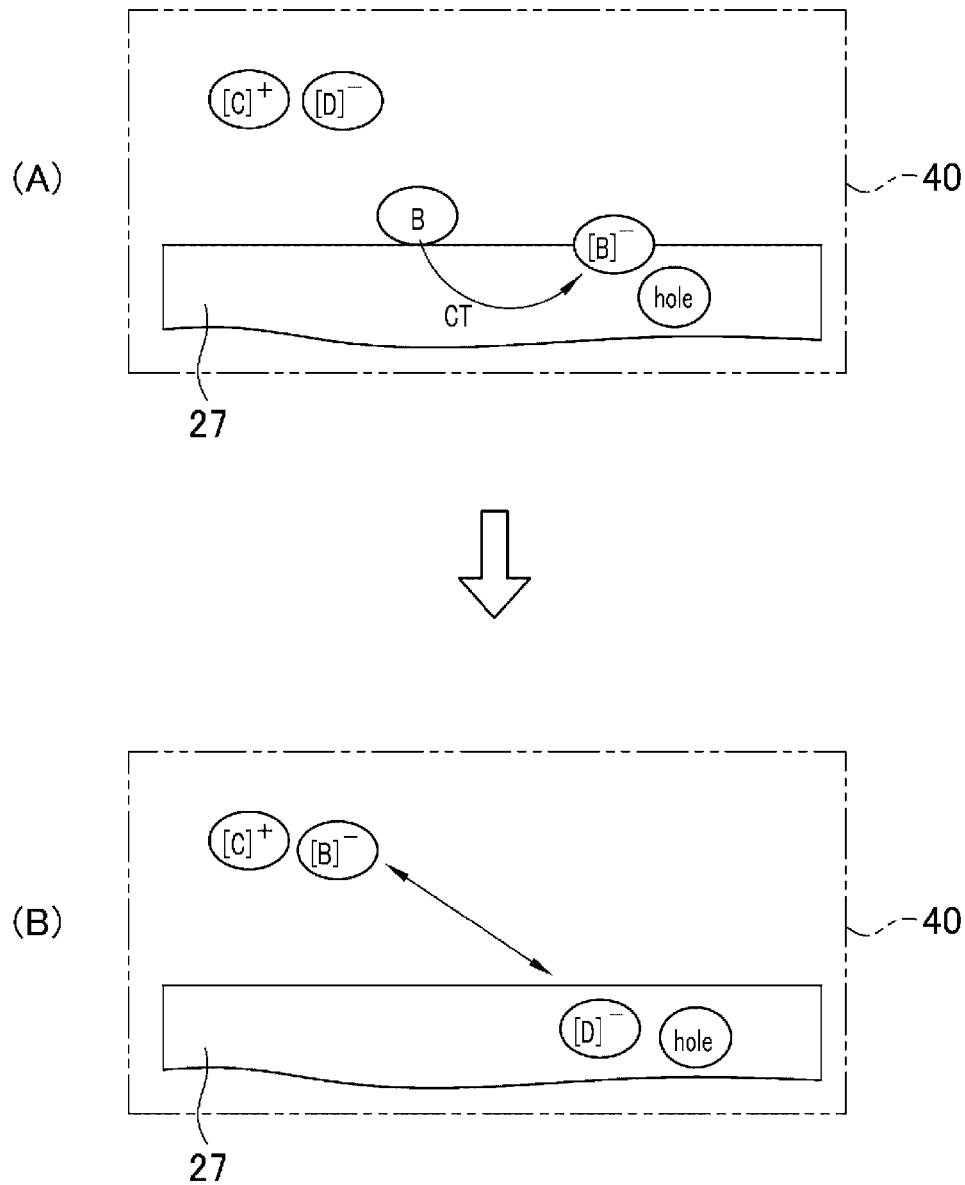
FIG. 7 Explanatory views showing the state of doping a polymer film using ion exchange.

FIG. 7 diagrammatically shows the state of the polymer film 27 being doped in the case where the polymeric semiconductor is of a P type. When the polymer film 27 is immersed in the treatment liquid 40, a redox reaction of the polymeric semiconductor (A) and the initiator dopant (B) represented by the formula (3) below is caused on the surface of the polymer film 27 (FIG. 7(A)). Specifically, an intermediate ([A]$^+$[B]$^-$) composed of the cation ([A]$^+$) of the polymeric semiconductor and the anion ([B]$^-$) as the initiator dopant is formed, and, in this instance, charge transfer occurs between the polymeric semiconductor and the initiator dopant, so that carriers (holes in this example) are injected into the polymeric semiconductor.

[Math. 2]

$$A+B \rightleftarrows [A]^+[B]^- \quad (3)$$

The redox reaction of the polymeric semiconductor and the initiator dopant represented by the formula (3) is reversible, and, after the reaction has reached a state of equilibrium, the amount of the intermediate formed is not increased. That is, doping of the polymer film 27 with the initiator dopant does not proceed after reaching a state of equilibrium. However, when an anion ([D]$^-$) as the alternative ion, which is more likely to chemically form a pair with the cation ([A]$^+$) of the polymeric semiconductor than the anion ([B]$^-$) as the initiator dopant, or which is high in concentration in the treatment liquid 40, is present in the treatment liquid 40, as shown in the formula (4) below, the anion ([B]$^-$) as the initiator dopant forming the intermediate is replaced (ion exchanged) by the anion ([D]$^-$) as the alternative ion (FIG. 7(B)). This replacement causes a redox reaction of the polymeric semiconductor and the initiator dopant so as to maintain the state of equilibrium, and further the anion ([B]$^-$) as the initiator dopant in the intermediate formed by the redox reaction is replaced by the anion ([D]$^-$) as the alternative ion. As a result, a state is obtained such that the polymer film 27 is doped with the alternative ion.

[Math. 3]

$$[A]^+[B]^- + [D]^- \rightarrow [A]^+[D]^- + [B]^- \quad (4)$$

When the polymer film 27 is formed from PBTTT-C14 (referred to as "PBTTT") which is a P type polymeric semiconductor, the initiator dopant is F$_4$TCNQ, the alternative ion is TFSI$^-$, and the spectator ion is EMMI$^+$, the formulae (3) and (4) above are represented by the formulae (5) and (6) below. PBTTT-C14 indicates poly[2,5-bis(3-tetradecylthiophen-2-yl)thieno[3,2-b]thiophene], TFSI indicates bis(trifluoromethanesulfonyl)imide, and EMIM indicates 1-ethyl-3-methylimidazolium.

[Math. 4]

$$PBTTT + F_4TCNQ \rightleftarrows [PBTTT]^+[F_4TCNQ]^- \quad (5)$$

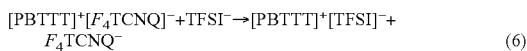

$$[PBTTT]^+[F_4TCNQ]^- + TFSI^- \rightarrow [PBTTT]^+[TFSI]^- + F_4TCNQ^- \quad (6)$$

The alternative ion ([D]$^-$) moves in the in-plane direction and the thicknesswise direction of the polymer film 27 due to thermal diffusion and electrostatic interaction. Consequently, the alternative ion is introduced into not only the surface of the polymer film 27 but also the inside of the polymer film 27, obtaining a conductive polymer material having the polymer film 27 doped uniformly in the in-plane direction and the thicknesswise direction.

The component on the right side of the formula (5) for the equilibrium related to oxidation and reduction, i.e., the intermediate is markedly reduced by ion exchange (formula (6)), so that the state of equilibrium is not maintained, accelerating the redox reaction. For this reason, a doping amount higher than that obtained by the redox method is achieved. The intermediate formed in the redox reaction undergoes the reaction of the formula (6) and changes to be in the state on the right side of the formula. It can also be understood that the above reaction accelerates the redox reaction due to an energy gain derived from the interaction between ions or entropy gain in the reaction of ion exchange represented by the formula (6), or the like.

Figure 8:
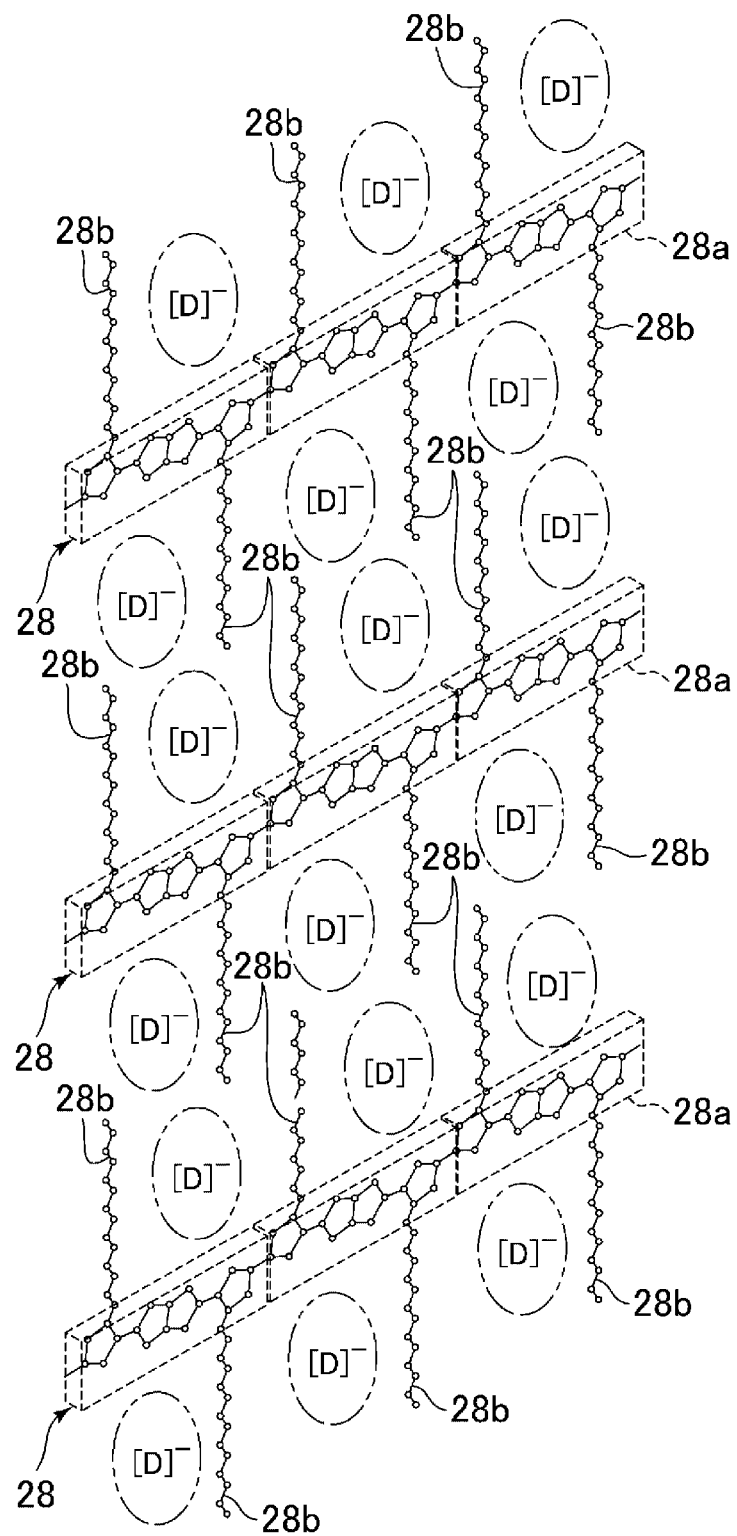
FIG. 8 An explanatory view showing the state of the dopant introduced into the polymer film by ion exchange.

Irrespective of the depth in the surface of the polymer film 27, the alternative ion in a satisfactory amount is uniformly introduced into the all region of the polymer film 27 in the thicknesswise direction thereof. In the example of the polymer film 27 diagrammatically shown in FIG. 8, the number of the alternative ion ([D]$^-$) contained in each of the polymeric semiconductors 28 is one per one space between a pair of side chains 28b adjacent to each other in the orientation direction of the polymeric semiconductors 28. When using the ion exchange method, the polymer film 27 can be doped in such an increased doping amount that the number of the alternative ion ([D]$^-$) contained in each of the polymeric semiconductors 28 can be at largest two per one space between a pair of side chains 28b adjacent to each other in the orientation direction of the polymeric semiconductors 28.

Further, when using the ion exchange method, irrespective of the thickness of the polymer film 27, the polymer film can be doped uniformly in the thicknesswise direction thereof, and therefore the ion exchange method is advantageously used in doping the polymer film 27 having a large thickness formed in the above-mentioned film formation step. Furthermore, with respect to the conductive polymer material produced by doping the polymer film 27 using the ion exchange method, it has been found that the conductive polymer material in the doped state is improved in stability to heat and stability in air. Similar results are obtained in the case where the polymeric semiconductor in the polymer film 27 is of an N type.

In the case of conducting doping by an ion exchange method, as the P type polymeric semiconductor, there is used one in which the HOMO level satisfies the predetermined requirement for the LUMO level of the initiator dopant as mentioned below, and which is obtained by polymerizing or copolymerizing the below-shown functional group or a derivative thereof, or copolymerizing the functional group or a derivative thereof and another functional group having conjugation. As the N type polymeric semiconductor, there is used one in which the LUMO level satisfies the predetermined requirement for the HOMO level of the initiator dopant as mentioned below, and which is obtained by polymerizing or copolymerizing the below-shown functional group or a derivative thereof, or copolymerizing the functional group or a derivative thereof and another functional group having conjugation.

The functional group for the P type and N type polymeric semiconductors is benzene, naphthalene, anthracene, pyrene, thiophene, cyclopentadithiophene, thienothiophene, thienoacene, naphthodithiophene, triphenylamine, benzothiadiazole, indigo, isoindigo, pyrrole, diketopyrrolopyrrole, naphthalenediimide, or perylenediimide. When the polymer film 27 is formed by the above-mentioned method, a polymeric semiconductor soluble in an organic solvent is used.

Specific examples of P type polymeric semiconductors include PBTTT-C14, poly[2,5-(2-octyldodecyl)-3,6-diketopyrrolopyrrole-alt-5,5-(2,5-di(thien-2-yl)thieno[3,2-b]thiophene)] (PDPP2T-TT-OD), and poly[2,5-(2-octyldodecyl)-3,6-diketopyrrolopyrrole-alt-(di (thienothien-2-yl) thiophene)] (PDPP2TT-T). Specific examples of N type polymeric semiconductors include poly{[N,N'-bis(2-octyldodecyl)naphthalene-1,4,5,8-bis(dicarboximide)-2,6-diyl]-alt-5,5'-(2,2'-bithiophene)} (N2200 or P(NDI2OD-T2).

When using a P type polymeric semiconductor, as the initiator dopant, a molecule capable of receiving an electron in the LUMO level thereof to oxidize another molecule, or a metal complex is used. Specific examples of such initiator dopants include 7,7,8,8-tetracyanoquinodimethane (TCNQ), 2-fluoro-7,7,8,8-tetracyano-quinodimethane (F1-TCNQ), 2,5-difluoro-7,7,8,8-tetracyano-quinodimethane (F2-TCNQ), 2,3,5-trifluoro-7,7,8,8-tetracyano-quinodimethane (F3-TCNQ), $F_4$TCNQ, F6TCNNQ, DDQ, tri(dicyanoethylene)cyclopropane (CN6-CP), and Mo(tfd-COCF$_3$)$_3$ molecules, metal complexes, and derivatives thereof.

When using a P type polymeric semiconductor, the requirement: "VH1≥VL1−1.0 (eV)" is satisfied wherein the HOMO level of the polymeric semiconductor, based on the vacuum level, is VH1(eV), and the LUMO level of the initiator dopant, based on the vacuum level, is VL1 (eV).

When using a P type polymeric semiconductor, as the alternative ion, an anion having a closed shell structure capable of forming a salt, together with the spectator ion, is used. Examples of such alternative ions include ions, such as TFSI, tetrafluoroborate (BF$_4$), hexafluorophosphate (PF$_6$), hexafluoroantimonate (SbF$_6$), a carbonate ion, a sulfonate ion, a nitrate ion, a phosphate ion, a thiocyanate ion, a cyanate ion, a chloride ion, a bromide ion, an iodide ion, a triiodide ion, a fluoride ion, trifluoro[tri(pentafluoroethyl)] phosphate (FAP), bis(pentafluoroethanesulfonyl)imide (TFESI), a bis(oxalato)borate ion (BOB), a bis(malonato) borate ion (MOB), a tetrakis(pentafluorophenyl)borate ion (PFPB), tetrakis(3 5-trifluoromethyl)phenylborate (TFPB), and an iron tetrachloride ion (FeCl$_4$), and derivatives thereof.

When using a P type polymeric semiconductor, the spectator ion is a cation having a closed shell structure capable of forming a salt, together with the alternative ion. Examples of such spectator ions include ions of metals, such as Li, Na, Cs, Mg, Ca, Cu, and Ag, metal ions of the above metals modified with a cyclic ether or the like, organic molecular ions, such as imidazolium, morpholinium, piperidinium, pyridinium, pyrolodinium, ammonium, and phosphonium, and derivatives thereof.

When using an N type polymeric semiconductor, as the initiator dopant, a molecule capable of donating an electron to reduce another molecule, or a metal complex is used. Specific examples of such initiator dopants include cobaltocene, decamethylcobaltocene, ruthenocene, ferrocene, and 1,3-dimethyl-2-phenyl-2,3-dihydro-1H-benzimidazole.

When using an N type polymeric semiconductor, the requirement: "VL2≤VH2+1.0 (eV)" is satisfied wherein the LUMO level of the organic semiconductor, based on the vacuum level, is VL2 (eV), and the HOMO level of the initiator dopant, based on the vacuum level, is VH2 (eV).

When using an N type polymeric semiconductor, as the alternative ion, a cation having a closed shell structure capable of forming a salt, together with the spectator ion, is used. Examples of such alternative ions include ions of metals, such as Li, Na, Cs, Mg, Ca, Cu, and Ag, metal ions of the above metals modified with a cyclic ether or the like, organic molecular ions, such as imidazolium, morpholinium, piperidinium, pyridinium, pyrrolidinium, ammonium, and phosphonium, and derivatives thereof.

When using an N type polymeric semiconductor, the spectator ion is an anion having a closed shell structure capable of forming a salt, together with the alternative ion. Examples of such spectator ions include ions, such as BF4, PF6, SbF6, a carbonate ion, a sulfonate ion, a nitrate ion, a phosphate ion, a thiocyanate ion, a cyanate ion, a chloride ion, a bromide ion, an iodide ion, a triiodide ion, a fluoride ion, FAP, TFSI, TFESI, BOB, MOB, PFPB, TFPB, and FeCl$_4$, and derivatives thereof.

For achieving a reaction in which the initiator dopant forming the intermediate is replaced by the alternative ion, a pair of the initiator dopant and the spectator ion is formed so as to stabilize the Gibbs free energy of the system, or a pair of the polymeric semiconductor and the alternative ion is formed so as to stabilize the Gibbs free energy of the system.

The above-mentioned doping by a redox method or ion exchange method can be applied to a polymer film formed by a method different from the above-mentioned film formation step, such as spin coating. The doping by a redox method or ion exchange method is advantageously used for a polymer film having a thickness of, for example, at least 30 nm or more, and is extremely advantageously used for a polymer film having a large thickness. Needless to say, a thin polymer film can be advantageously doped by these doping methods. Further, the doping by a redox method or ion exchange method can be used in doping for not only an edge-on oriented polymer film but also a flat-on orientated polymer film.

In the conductive polymer film which is formed from a polymeric semiconductor containing a dopant therein, and which is formed by conducting the doping by a redox method or ion exchange method as mentioned above, the ionization potential shifts. For example, in the case of doping a P type polymeric semiconductor, doping abstracts an electron from the HOMO level of the polymeric semiconductor, so that the ionization potential is increased. In the case of doping an N type polymeric semiconductor, doping donates an electron to the LUMO level of the polymeric semiconductor, so that the ionization potential is reduced. The ionization potential of the conductive polymer film is equivalent to the work function and Fermi level.

Particularly, when using the ion exchange method, efficient and effective doping is made as mentioned above, and therefore, in the conductive polymer film, the work function remarkably shifts, and especially in the P type conductive polymer film, an increase of the work function is more remarkable. With respect to the P type conductive polymer film, it has been found that the work function of the conductive polymer film can be increased to 5.5 eV or more. It has also been found that, when using PBTTT-C14 as the P type polymeric semiconductor, the work function of the conductive polymer film can be increased to 5.6 eV or more.

In the ion exchange method, the work function of the conductive polymer film can be changed by controlling the treatment liquid 40 in respect of the type and concentration of the initiator dopant, the concentration and type of the salt (alternative ion and spectator ion), and the type of the solvent. As an example of the method, there can be mentioned a method of controlling the concentration of the initiator dopant or the concentration of the salt, and, by increasing the concentration of the initiator dopant or salt, the work function of the P type conductive polymer film can be increased, or the work function of the N type conductive polymer film can be reduced.

Second Embodiment

The second embodiment which is a field effect transistor using the conductive polymer material as a drain electrode and a source electrode is described below.

Figure 9:
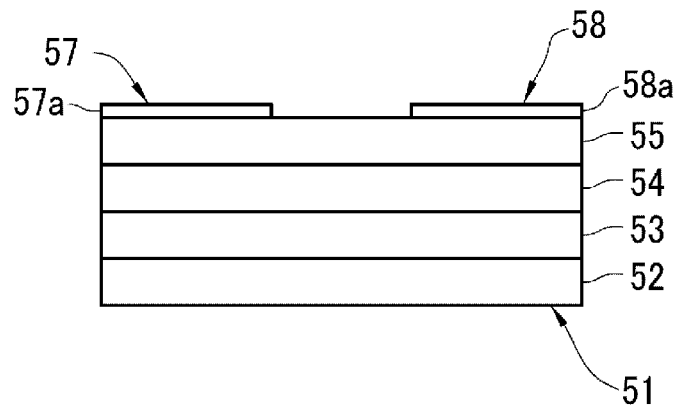
FIG. 9 An explanatory view showing the construction of a field effect transistor according to a second embodiment.

In FIG. 9, a field effect transistor 51 in this example is of a bottom-gate top-contact type, and, on a substrate 52, a gate electrode 53, an insulating layer 54, and a semiconductor layer 55 are stacked in this order from the substrate 52 side. On the surface of the semiconductor layer 55 (the surface on the side opposite to the insulating layer 54), a drain electrode 57 and a source electrode 58 are formed at a predetermined gap between them. The semiconductor layer 55 is formed from a material having semiconducting properties, such as an organic low molecular-weight semiconductor or a polymeric semiconductor, but, in this example, injection and storage of carriers from the drain electrode 57 and the source electrode 58 are made, and therefore a material which is unlikely to be doped, a material such that it is difficult to dope a limited region of the material, or the like can be used.

The drain electrode 57 is composed of a P type conductive polymer layer 57a, and the source electrode 58 is composed of a conductive polymer layer 58a. These conductive polymer layers 57a, 58a are formed in close contact with the semiconductor layer 55. Each of the conductive polymer layers 57a, 58a is formed from a conductive polymer material obtained by doping a polymeric semiconductor, and is a conductive polymer film formed from a polymeric semiconductor containing a dopant therein.

With respect to the method for doping a polymeric semiconductor when forming the conductive polymer layers 57a, 58a, there is no particular limitation as long as the P type conductive polymer layers 57a, 58a having an increased work function can be obtained, and any of the above-mentioned redox method and ion exchange method can be used.

By using the redox method or ion exchange method, the number of the dopant contained is in the range of from ⅓ to 2 per one space between a pair of side chains adjacent to each other in the orientation direction of the polymeric semiconductor, and thus the work function of the conductive polymer layers 57a, 58a can be increased. That is, the conductive polymer layers 57a, 58a, in which the number of the dopant contained is in the range of from ⅓ to 2 per one space between a pair of side chains adjacent to each other in the orientation direction of the polymeric semiconductor, have an increased work function, and thus is preferred as the drain electrode 57 and the source electrode 58. The ion exchange method is especially preferred because the ionization potential of the conductive polymer material can be considerably increased by efficient and effective doping. The conductive polymer film that is formed by the ion exchange method and has a work function of 5.5 eV or more, which is equivalent to or larger than that of gold (work function: 5.47 eV), is preferred as the conductive polymer layers 57a, 58a.

In this example, as the semiconductor layer 55, 3,11-dioctyldinaphtho[2,3-d:2',3'-d']benzo[1,2-b:4,5-b']di thiophene (DNBDT-NW) which is not doped is used. As the conductive polymer layers 57a, 58a, a conductive polymer film obtained by doping a polymer film composed of PBTTT-C14 by an ion exchange method is formed. Specifically, patterning of a polymer film composed of PBTTT-C14 is performed on the surface of the semiconductor layer 55, and then the semiconductor layer is doped by an ion exchange method, and the polymeric semiconductor film of PBTTT-C14 is doped by an ion exchange method to form a P type conductive polymer film, and the formed P type conductive polymer film is used as the conductive polymer layers 57a, 58a. In the doping, the conductive polymer layers 57a, 58a having a work function of 5.5 eV or more are formed using the treatment liquid 40 (see FIG. 7) having appropriately controlled the concentration and type of the initiator dopant and salt (alternative ion and spectator ion) and the type of the solvent, but the work function is not limited to this value.

With respect to the method for forming the polymer film which constitutes the conductive polymer layers 57a, 58a and the method for forming the semiconductor layer 55 from a polymeric semiconductor, there is no particular limitation, and the polymer film and semiconductor layer can be formed by, for example, a method similar to the film formation step in the first embodiment, a spin coating method, or the like. The polymer film which constitutes the conductive polymer layers 57a, 58a, and the semiconductor layer 55 can also be formed by a PVD method, such as a vacuum vapor deposition method, a plate printing method or a plate-less printing method using an ink containing an organic semiconductor material forming a polymer film, an edge casting method or a continuous edge casting method using a solution having dissolved therein an organic semiconductor material, or the like. The edge casting method is described in detail in, for example, JP-A-2015-185620, and the continuous edge casting method is described in detail in JP-A-2017-147456.

Figure 10:
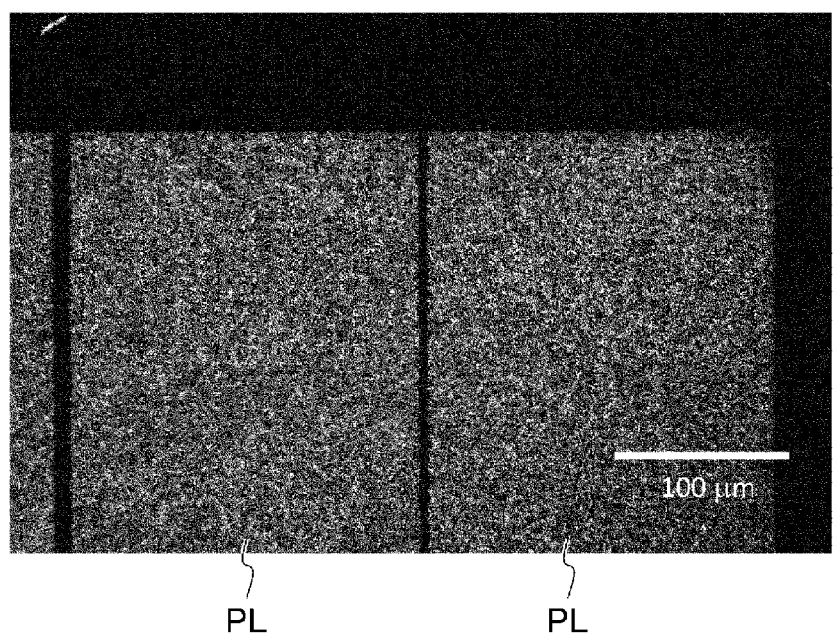
FIG. 10 A photograph image showing the conductive polymer layer produced using photolithography.

Patterning of the polymer film forming the conductive polymer layers 57a, 58a can be conducted by wet etching or dry etching using photolithography and using a resist formed in a predetermined pattern as a mask. It has been found that a fine pattern as small as about 5 μm can be formed in a polymer film having a thickness of about 150 nm by such patterning. For reference, a photograph of the patterned conductive polymer layer is shown in FIG. 10. In FIG. 10, the conductive polymer layer is indicated by reference character PL. When using a YAG laser or the like, patterning can be performed before and after doping.

By forming the P type conductive polymer layers 57a, 58a having an increased work function as mentioned above so as to be in close contact with the semiconductor layer 55, carriers (holes) are injected from the conductive polymer layers 57a, 58a into the semiconductor layer 55 and stored. By virtue of this, a channel having a high conductivity can be formed in the semiconductor layer 55 without subjecting the semiconductor layer 55 to doping treatment, achieving high mobility. Consequently, the field effect transistor 51 having excellent properties can be obtained.

By forming the conductive polymer layers 57a, 58a having an increased work function so as to be in close contact with the semiconductor layer 55 as mentioned above, injection of carriers into the semiconductor layer 55 can increase the conductivity, and therefore the doping process for the semiconductor layer 55 can be omitted. Further, a material which is unlikely to be doped, a material such that it is difficult to dope a limited region of the material, or the like can be used as the semiconductor layer 55.

The N type conductive polymer layers 57a, 58a may be formed using an N type polymeric semiconductor. The N type conductive polymer layers 57a, 58a may be formed using the above-mentioned redox method or ion exchange method or the like, like those of a P type, and be reduced in the work function, and it is preferred that the number of the dopant contained is in the range of from ⅓ to 2 per one space between a pair of side chains adjacent to each other in the orientation direction of the polymeric semiconductor, achieving reduction of the work function. When the conductive polymer layers 57a, 58a are of an N type, the carriers to be injected into the semiconductor layer 55 are electrons.

The type of the polymeric semiconductor, the type of the dopant, and preferred conditions therefor and the like usable when forming the conductive polymer layers 57a, 58a using the redox method are similar to those usable when forming the conductive polymer film (conductive polymer material) using the redox method in the first embodiment. The type of the polymeric semiconductor, the initiator dopant, the type of the salt (alternative ion and spectator ion), and preferred conditions therefor and the like usable when forming the conductive polymer layers 57a, 58a using the ion exchange method are similar to those usable when forming the conductive polymer film (conductive polymer material) using the ion exchange method in the first embodiment.

When the conductive polymer layers 57a, 58a are of a P type, from the viewpoint of efficient injection of carriers, it is desired that the work function of the conductive polymer layers 57a, 58a is equivalent to or higher than the ionization potential of the semiconductor layer 55. Even when the work function of the conductive polymer layers 57a, 58a is equivalent to the ionization potential of the semiconductor layer 55, it is desired that the conductive polymer layers 57a, 58a have a work function higher than a value obtained by subtracting 0.1 eV from the ionization potential of the semiconductor layer 55. As the work function of the conductive polymer layers 57a, 58a becomes further higher than the ionization potential of the semiconductor layer 55, the amount of the holes stored in the semiconductor layer 55 is increased, so that more excellent injection properties can be obtained.

On the other hand, when the conductive polymer layers 57a, 58a are of an N type, from the viewpoint of efficient injection of carriers, it is desired that the work function of the conductive polymer layers 57a, 58a is equivalent to or lower than the ionization potential of the semiconductor layer 55. Even when the work function of the conductive polymer layers 57a, 58a is equivalent to the ionization potential of the semiconductor layer 55, it is desired that the conductive polymer layers 57a, 58a have a work function lower than a value obtained by adding 0.1 eV to the ionization potential of the semiconductor layer 55. As the work function of the conductive polymer layers 57a, 58a becomes further lower than the ionization potential of the semiconductor layer 55, the amount of the electrons stored in the semiconductor layer 55 is increased, so that more excellent injection properties can be obtained.

Figure 11:
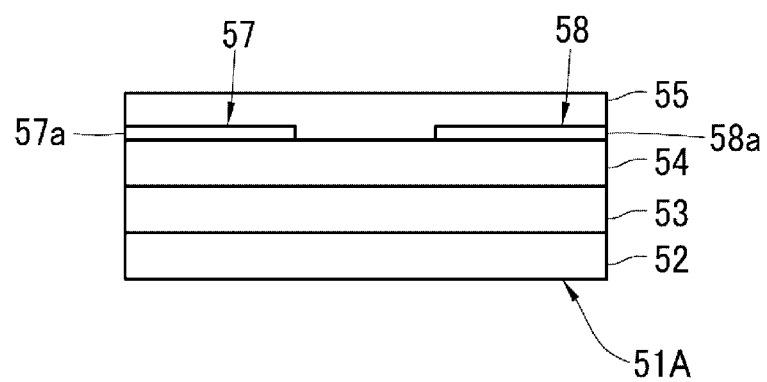
FIG. 11 An explanatory view showing an example of a bottom-gate bottom-contact field effect transistor.
Figure 12:
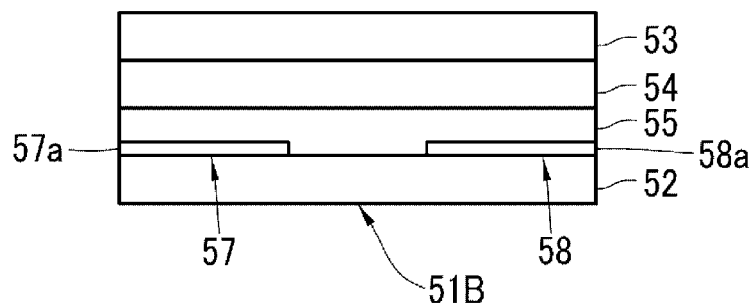
FIG. 12 An explanatory view showing an example of a top-gate bottom-contact field effect transistor.
Figure 13:
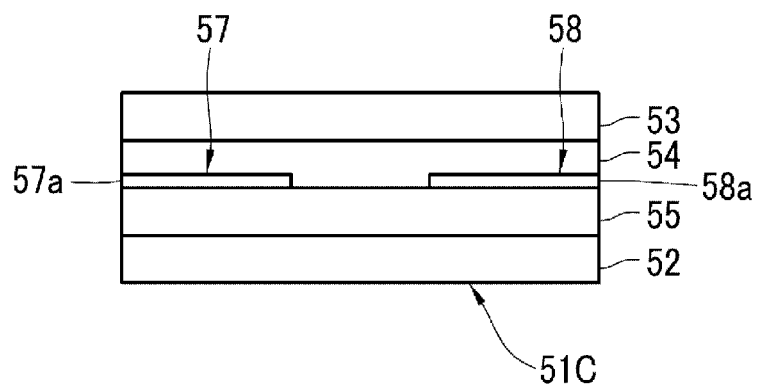
FIG. 13 An explanatory view showing an example of a top-gate top-contact field effect transistor.

Explanation is made above on an example of the field effect transistor having a bottom-gate top-contact structure, but the type of the structure may be any of a bottom-gate bottom-contact type, a top-gate bottom-contact type, and a top-gate top-contact type, of which the respective examples are shown in FIGS. 11 to 13.

As shown in FIG. 11, in a bottom-gate bottom-contact field effect transistor 51A, like the field effect transistor 51, the gate electrode 53, the insulating layer 54, and the semiconductor layer 55 are stacked on the substrate 52, and the drain electrode 57 and the source electrode 58 are formed on the lower surface of the semiconductor layer 55 (the surface on the insulating layer 54 side). In a bottom-gate bottom-contact field effect transistor 51B shown in FIG. 12 and a top-gate top-contact field effect transistor 51C shown in FIG. 13, the semiconductor layer 55, the insulating layer 54, and the gate electrode 53 are stacked in this order from the substrate 52 side. Of these, in the bottom-contact field effect transistor 51B, the drain electrode 57 and the source electrode 58 are formed on the lower surface of the semiconductor layer 55 (the surface on the substrate 52 side), and, in the top-contact field effect transistor 51C, the drain electrode 57 and the source electrode 58 are formed on the upper surface of the semiconductor layer 55 (the surface on the insulating layer 54 side). Such a construction is similar to the structure of a conventional field effect transistor.

The conductive polymer layer (conductive polymer film) and a conductor, such as a metal, have such a high carrier density that efficient injection of carriers occurs between them. Therefore, as seen in an example of a field effect transistor 51D shown in FIG. 14, it is preferred that the drain electrode 57 has a stacked structure of the conductive polymer layer 57a and a metal layer 57b and the source electrode 58 has a stacked structure of the conductive polymer layer 58a and a metal layer 58b. In this case, the conductive polymer layers 57a, 58a are formed in close contact with the semiconductor layer 55, and the metal layers 57b, 58b are formed on the surface of the respective conductive polymer layers 57a, 58a on the side opposite to the semiconductor layer 55 (the upper surface in the example shown in the figure). A voltage is applied from the outside to the drain electrode 57 and the source electrode 58 through the metal layers 57b, 58b. Injection of carriers into the semiconductor layer 55 from the conductive polymer layers 57a, 58a is caused, and therefore the metal layers 57b, 58b can be formed using a material having a high work function, such as gold (Au), or a material having a low work function, such as aluminum (Al).

Third Embodiment

The third embodiment which is the photoelectric conversion element using a conductive polymer material as a buffer layer is described.
(Organic EL Element)

Figure 15:
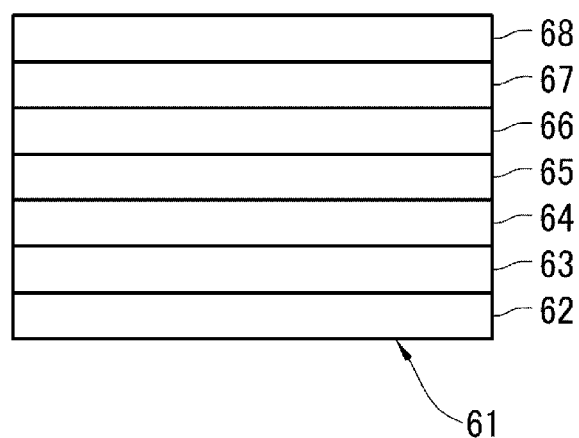
FIG. 15 An explanatory view showing the construction of an organic EL element according to a third embodiment.

In FIG. 15, an organic EL (organic electroluminescence) element (OLED) 61 as the photoelectric conversion element has a structure in which, on a transparent substrate 62 made of glass or the like, an anode (hole injection electrode) 63, a conductive polymer layer 64 as a hole injection layer, a hole transport layer 65, a light emitting layer 66, an electron transport layer 67, and a cathode (electron injection electrode) 68 are stacked in this order from the transparent substrate 62 side. Like a conventional organic EL element, the organic EL element 61 emits a light out of the element through the transparent hole transport layer 65, conductive polymer layer 64, and transparent substrate 62, wherein the light is caused by recombination of holes and electrons injected into the light emitting layer 66 when a voltage is applied between the anode 63 and the cathode 68.

The anode 63 is a transparent electrode, and is an ITO (indium tin oxide) thin film in this example. The conductive polymer layer 64 and the hole transport layer 65 constitute a buffer layer group, and are formed as a buffer layer for adjusting the energy barrier at the interface between the anode 63 and the light emitting layer 66, namely, for energy level matching. In this example, by forming two buffer layers on the hole transport side between the anode 63 and the light emitting layer 66, more suitable energy level matching is achieved. The conductive polymer layer 64 is formed as a buffer layer which is present nearest to the anode 63, in this example, is connected to the anode 63, and stacked on the light emitting layer through the hole transport layer 65, and the hole transport layer 65 is formed as a buffer layer in close contact with the light emitting layer 66.

The conductive polymer layer 64 is a P type conductive polymer film being formed from a polymeric semiconductor containing a dopant therein, and having an increased work function. With respect to the conductive polymer layer 64 in this example, a conductive polymer film which is obtained by doping a polymer film of PBTTT-C14 by an ion exchange method, and which has a work function of, for example, 5.5 eV or more is used, but the work function is not limited to this value. The hole transport layer 65 is a thin film of N,N'-di-1-naphthyl-N,N'-diphenylbenzidine (α-NPD).

The light emitting layer 66 emits a light caused by recombination of holes and electrons injected as mentioned above, and is formed as a photoelectric conversion layer which converts electric energy to light energy. The light emitting layer 66 is formed from a semiconductor material containing, for example, an organic semiconductor, a metal complex, an organic-inorganic hybrid perovskite material, or the like. In this example, tris(8-quinolinolato)aluminum (Alq3) is used in the light emitting layer 66. The electron transport layer 67 is formed as a buffer layer on the electron transport side for energy level matching at the interface between the light emitting layer 66 and the cathode 68, and is a thin film of lithium fluoride (LiF) in this example. As the cathode 68, for example, aluminum is used.

In the above-mentioned construction, the conductive polymer layer 64 and hole transport layer 65 present on the anode 63 side need to have transmission properties that they transmit a light from the light emitting layer 66. The hole transport layer 65 has transmission properties by virtue of using a material similar to those used in a conventional organic EL element, such as α-NPD, as mentioned above.

Figure 16:
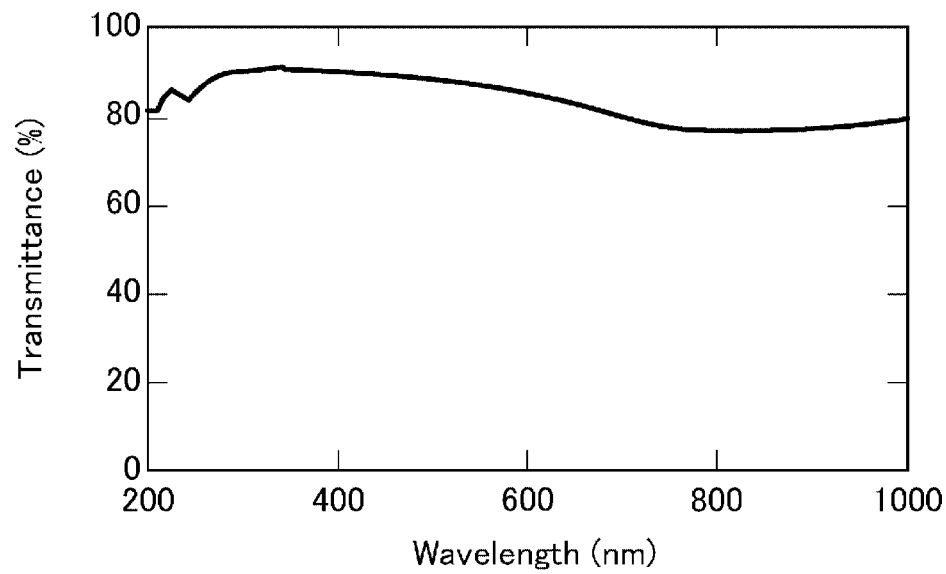
FIG. 16 A graph showing an example of the transmission properties of the conductive polymer layer.

The conductive polymer layer 64 is a conductive polymer film formed from a conductive polymer material having a high conductivity and having a high light transmittance in a wavelength range including the wavelength range of visible light, and, as an example of such conductive polymer material, there can be mentioned a conductive polymer material obtained by doping the PBTTT-C14. The present inventors have found that, with respect to the PBTTT-C14, as the doping amount is increased, the conductivity is increased and the light transmittance in a wavelength range including the wavelength range of visible light is increased. As an example of such findings, FIG. 16 shows transmission properties in the visible light region with respect to the conductive polymer film obtained by doping by an ion exchange method a polymer film of PBTTT-C14 having a thickness of 50 nm formed by spin coating. As seen from the transmission properties shown in the figure, by doping the polymer film of PBTTT-C14, high transmission properties in the visible light region can be obtained.

The type of the polymeric semiconductor constituting the conductive polymer layer 64 is not limited to PBTTT-C14, and any polymeric semiconductor can be used as long as it is a conductive polymer material having a high conductivity and having a high light transmittance in a wavelength range including the wavelength range of visible light. As examples of polymeric semiconductors such that, like PBTTT-C14, as the doping amount is increased, the conductivity is increased and the transmittance is increased, there can be mentioned, for example, polythiophene derivatives, PDPP2T-TT-OD, and PDPP2TT-T, and the conductive polymer layer 64 can be formed using the above material.

With respect to the method for forming a polymeric semiconductor film which constitutes the conductive polymer layer 64 and the method for doping the polymer film, the same methods as used in forming the conductive polymer layer for the source electrode and the drain electrode in the second embodiment can be used. In this case, particularly, the ion exchange method is especially preferred because the work function of the polymer film can be considerably increased by efficient and effective doping. In this example, the conductive polymer film in which the number of the dopant contained is in the range of from ⅓ to 2 per one space between a pair of side chains adjacent to each other in the orientation direction of the polymeric semiconductor, or the P type conductive polymer film having a work function of 5.5 eV or more is preferred as the buffer layer and the below-mentioned conductive polymer layer 64 having a function of an anode. It is preferred that the polymer film which constitutes the conductive polymer layer 64 is uni-axially oriented for achieving high transmittance.

By using the conductive polymer film having an increased work function as the conductive polymer layer 64 as mentioned above, holes are efficiently injected from the conductive polymer layer 64 to the hole transport layer 65 and further to the light emitting layer 66, so that light emission occurs in the light emitting layer 66. PEDOT:PSS which is used in a conventional organic EL element as a hole injection layer has a work function of 5.0 eV, and, as compared to such a conventional organic EL element, the conductive polymer layer 64 has a high work function, and thus holes are more efficiently injected, achieving light emission in the light emitting layer 66.

Figure 17:
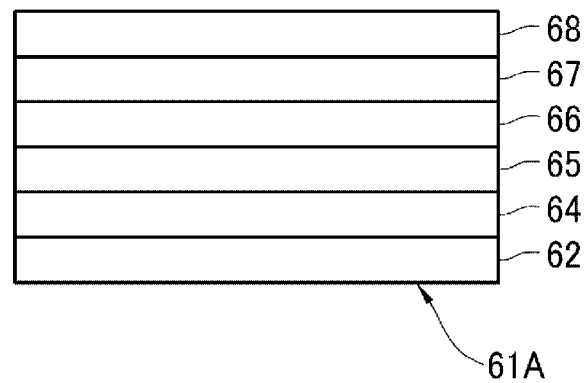
FIG. 17 An explanatory view showing the construction of an example of the organic EL element in which the conductive polymer layer is formed as an anode and a hole injection layer.

As shown in an organic EL element 61A of FIG. 17, a structure may be employed in which the conductive polymer layer 64, the hole transport layer 65, the light emitting layer 66, the electron transport layer 67, and the cathode 68 are stacked in this order from the transparent substrate 62 side, and the conductive polymer layer 64 functions as an anode and a hole injection layer. The conductive polymer layer 64 formed as mentioned above has a high conductivity, and thus can function as an anode. Alternatively, as shown in an organic EL element 61B of FIG. 18, a structure may be employed in which the conductive polymer layer 64, the light emitting layer 66, the electron transport layer 67, and the cathode 68 are stacked in this order from the transparent substrate 62 side, and the light emitting layer 66 is directly stacked on the conductive polymer layer 64. The conductive polymer layer 64 has a high work function, and therefore only one layer of the conductive polymer layer 64 can be used as a buffer layer on the hole transport side.

Figure 19:
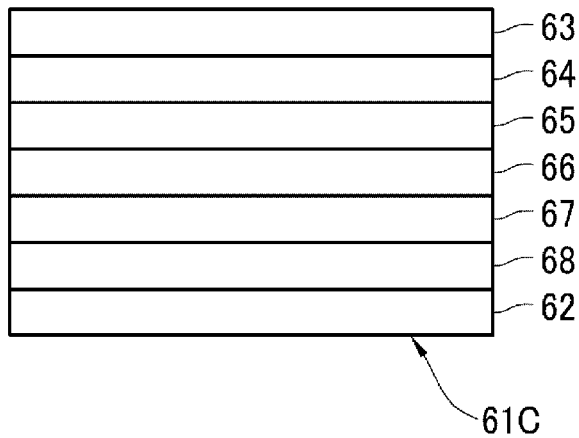
FIG. 19 An explanatory view showing the construction of an example of the organic EL element in which a light is taken out from the cathode side.

As shown in an organic EL element 61C of FIG. 19, a structure may be employed in which the cathode 68 which is a transparent electrode, such as an ITO thin film, the electron transport layer 67, the light emitting layer 66, the hole transport layer 65, the conductive polymer layer 64 as a hole injection layer, and the anode 63 are stacked in this order from the transparent substrate 62 side, and a light is taken out from the cathode 68 side. The conductive polymer layer 64 used in the construction of the organic EL element 61C need not be transparent.

Figure 20:
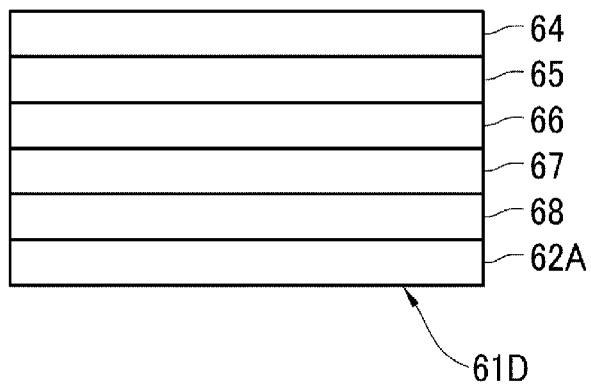
FIG. 20 An explanatory view showing the construction of an example of the organic EL element in which the conductive polymer layer is disposed as an anode on the side opposite to the substrate.

An organic EL element 61D shown in FIG. 20 has a structure in which the cathode 68, the electron transport layer 67, the light emitting layer 66, the hole transport layer 65, and the conductive polymer layer 64 are stacked in this order from a substrate 62A side, and the conductive polymer layer 64 is formed as an anode and a buffer layer. In the organic EL element 61D, a light can be taken out through a conductive polymer layer 74. In this case, the cathode 68 need not be a transparent electrode. Further, using the transparent substrate 62A and cathode 68, a light can be taken out from both the substrate 62A side and the conductive polymer layer 64. In the organic EL elements 61C, 61D, like the organic EL element 61B, the hole transport layer 65 can be omitted.

By using the conductive polymer layer 64 as mentioned above, the anode and part of the buffer layer can be omitted, making simple the structure of the organic EL element. In addition, this can reduce the steps in the production process for the organic EL element.

(Photovoltaic Element)

Figure 21:
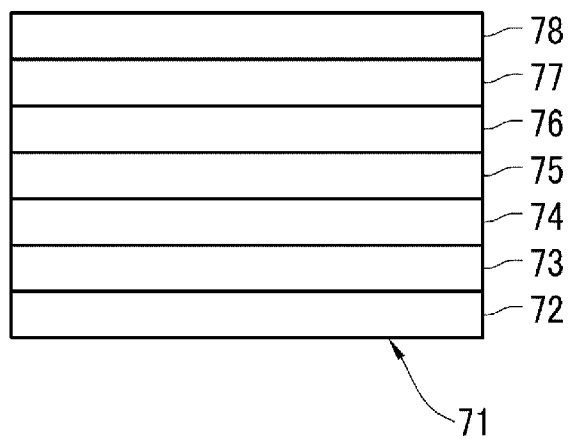
FIG. 21 An explanatory view showing the construction of the photovoltaic element according to the third embodiment.

A photovoltaic element as the photoelectric conversion element is described below. In FIG. 21, a photovoltaic element 71 has a structure in which, on a transparent substrate 72 made of glass or the like, an anode (hole collection electrode) 73, a conductive polymer layer 74, a hole transport layer 75, an electricity generating layer 76, an electron transport layer 77, and a cathode (electron collection electrode) 78 are stacked in this order from the transparent substrate 72 side.

A light, for example, sunlight enters the electricity generating layer 76 through the transparent substrate 72, anode 73, conductive polymer layer 74, and hole transport layer 75. The electricity generating layer 76 is formed as a photoelectric conversion layer which converts light energy to electric energy, and forms electrons and holes due to light incidence. In the electricity generating layer 76, a semiconductor material, such as an organic, inorganic, or organic-inorganic hybrid perovskite material, is used, and the electricity generating layer 76 is formed from a semiconductor material which itself exhibits conduction of both holes and electrons, or formed in the form of a mixed film of such two or more semiconductor materials. From the viewpoint of easy formation, preferred is an embodiment in which the electricity generating layer 76 is formed from a mixed film of organic semiconductors. The electricity generating layer 76 can be formed from a mixed film using a polymeric semiconductor and a fullerene derivative.

Details of the anode 73, conductive polymer layer 74, hole transport layer 75, electron transport layer 77, and cathode 78 are similar to those mentioned above in connection with the organic EL element. As a buffer layer on the hole transport side for energy level matching at the interface between the anode 73 and the electricity generating layer 76, the conductive polymer layer 74 and the hole transport layer 75 are formed, and constitute a buffer layer group. As a buffer layer on the electron transport side for energy level matching at the interface between the electricity generating layer 76 and the cathode 78, the electron transport layer 77 is formed. The use of the conductive polymer layer 74 having an increased work function effectively reduces an energy loss caused in the anode 73 and the electricity generating layer 76.

Figure 22:
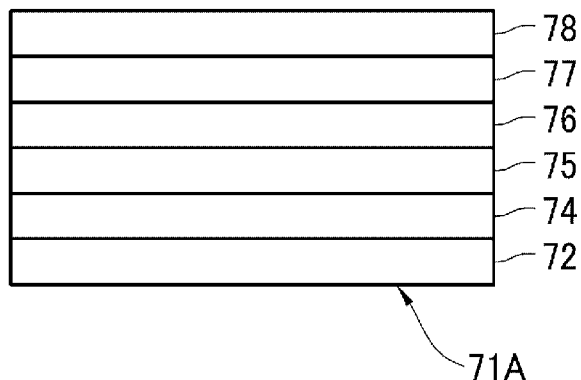
FIG. 22 An explanatory view showing the construction of an example of the photovoltaic element in which the conductive polymer layer is formed as an anode and a hole injection layer.
Figure 23:
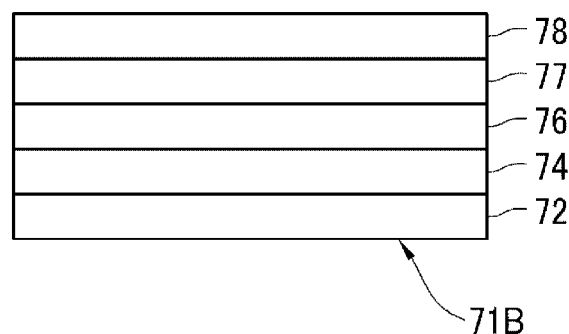
FIG. 23 An explanatory view showing the construction of an example of the photovoltaic element in which only one layer of the conductive polymer layer constitutes a buffer layer on the hole transport side.

The conductive polymer layer 74 has a high conductivity and hence can function as an anode. A photovoltaic element 71A shown in FIG. 22 has a structure in which the conductive polymer layer 74, the hole transport layer 75, the electricity generating layer 76, the electron transport layer 77, and the cathode 78 are stacked in this order from the transparent substrate 72 side, and the conductive polymer layer 74 is formed as an anode and a buffer layer. Further, the conductive polymer layer 74 has a high work function, and therefore, as shown in a photovoltaic element 71B of FIG. 23, only one layer of the conductive polymer layer 74 can constitute a buffer layer on the hole transport side. The photovoltaic element 71B has a structure in which the conductive polymer layer 74, the electricity generating layer 76, the electron transport layer 77, and the cathode 78 are stacked in this order from the transparent substrate 72 side, and the conductive polymer layer 74 is directly stacked on the electricity generating layer 76.

Figure 24:
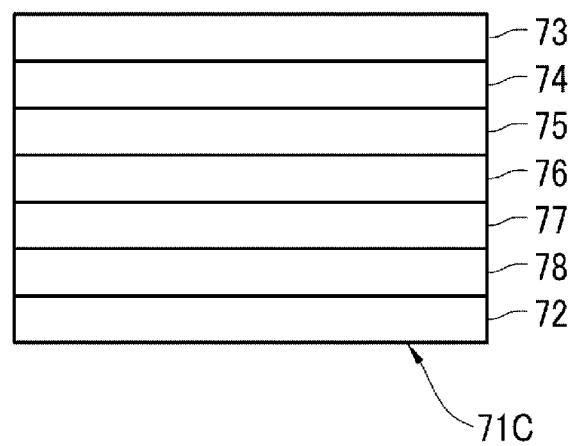
FIG. 24 An explanatory view showing the construction of an example of the photovoltaic element in which a light enters the element from the cathode side.

A photovoltaic element 71C shown in FIG. 24 has a structure in which the transparent cathode 78, such as an ITO thin film, the transparent electron transport layer 77, the electricity generating layer 76, the hole transport layer 75, the conductive polymer layer 74, and the anode 73 are stacked in this order from the transparent substrate 72 side. A light enters the photovoltaic element 71C from the cathode 78 side. The conductive polymer layer 74 used in the photovoltaic element 71C need not be transparent.

Figure 25:
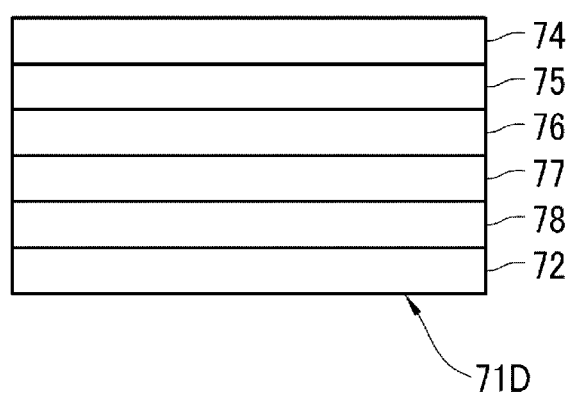
FIG. 25 An explanatory view showing the construction of an example of the photovoltaic element in which the conductive polymer layer is disposed as an anode on the side opposite to the substrate.

A photovoltaic element 71D of FIG. 25 has a structure in which the cathode 78, the electron transport layer 77, the electricity generating layer 76, the hole transport layer 75, and the conductive polymer layer 74 are stacked in this order from the substrate 72A side, and the conductive polymer layer 74 is formed as an anode and a buffer layer. In the photovoltaic element 71D, a light can enter the electricity generating layer 76 through the conductive polymer layer 74, or, using a transparent substrate 72A, a light can enter the electricity generating layer 76 from the substrate 72A side.

In each of the structures of the above-mentioned photovoltaic elements, one of or both of the hole transport layer 75 and the electron transport layer 77 can be omitted.

In the organic EL element and photovoltaic element having the above-mentioned construction, a hydrophobic solution and a polymeric semiconductor having low moisture absorption properties can be used when forming a conductive polymer layer by forming a polymeric semiconductor film and doping it, and therefore an adverse effect of water on the organic EL element and the photovoltaic element can be reduced. In contrast, for example, with respect to PEDOT:PSS used in a conventional organic EL element, a film is formed by applying a dispersion having PEDOT:PSS dispersed in water, and the formed film has high moisture absorption properties, and there is a concern about an adverse effect of the film on the organic EL element.

In the construction of the organic EL element or photovoltaic element in which the conductive polymer layer can function as an anode as mentioned above, the transparency and high conductivity of the conductive polymer layer contribute to achievement of an ITO-free device and efficient driving of a large-area device. In the large-area organic EL element and photovoltaic element, conduction in the in-plane direction is important, and an embodiment using the conductive polymer layer as an anode or the like is preferred. With respect to PEDOT:PSS, as a method for improving the work function, there has been known a method in which electronically insulating Nafion (registered trademark) is mixed with PEDOT:PSS to increase the work function, but this method markedly reduces the conductivity.

Explanation is made above on the example in which a conductive polymer layer is formed as a buffer layer related to transport of holes, but, as a buffer layer related to transport of electrons (for example, electron transport layer), a conductive polymer layer formed from an N type conductive polymer material can be provided. In this case, the conductive polymer layer can be reduced in work function by doping the polymeric semiconductor film by a redox method or an ion exchange method. A polymeric semiconductor suitable for forming such a conductive polymer layer is, for example, N2200 or P(NDI2OD-T2). These polymeric semiconductors are increased in conductivity by doping.

In the second and third embodiments, examples of the field effect transistor and the photoelectric conversion element are described, but the P type polymeric semiconductor film having a work function increased by doping as mentioned above can be used as an electrode, a transparent electrode, a buffer layer, or the like for various types of electronic devices. Further, the N type polymeric semiconductor film having a work function reduced by doping as mentioned above can be used as an electrode, a transparent electrode, a buffer layer, or the like for various types of electronic devices.

EXAMPLES

Example 1

The polymer film 27 having a size of 4 cm×4 cm was prepared in accordance with the procedure of the above-described film formation step, and a thickness of the periphery portion of the polymer film was measured. In the preparation of the polymer film 27, the solution 23 obtained by dissolving PBTTT as a polymeric semiconductor in o-dichlorobenzene as a solvent was used. The solution 23 had a concentration of 10% by mass. A load was uniformly applied to the solution film by means of the press member 25 until almost all the solvent in the solution film 23A was evaporated, and then the resultant polymer film 27 was peeled off from the press member 25, and a thickness of the periphery portion of the polymer film was measured. The load applied by the press member 25 to the solution film 23A per unit area was 0.8 g/cm².

Figure 26:
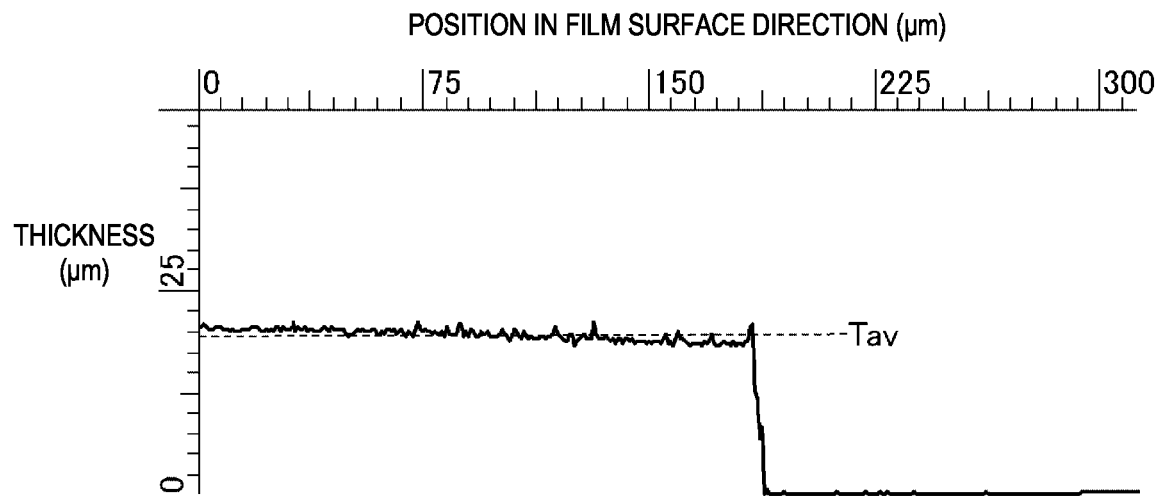
FIG. 26 A graph showing the results of the measurement of a thickness of the periphery portion of a polymer film.

The results of the measurement of a thickness of the periphery portion of the polymer film 27 are shown in FIG. 26. In FIG. 26, the abscissa indicates a position from the middle portion of the polymer film 27, and the ordinate indicates a thickness of the polymer film 27. The thickness of the periphery portion of the polymer film 27 is almost uniform, and it is apparent that a coffee ring effect such that the thickness of the periphery is increased was not caused. The straight line shown in the graph indicates an average Tav of the thickness in the measuring range, and the average Tav was 19.2 μm.

Example 2

Figure 27:
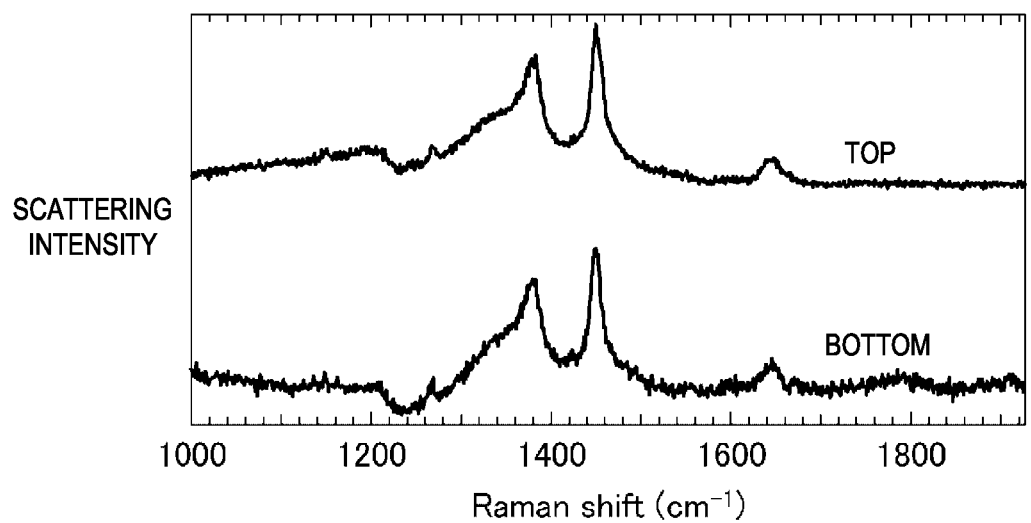
FIG. 27 A graph showing spectra of the Raman scattered light measured with respect to the top surface and bottom surface of the polymer film doped by ion exchange.

FIG. 27 shows the results of the measurement of Raman spectroscopy with respect to each of the top and bottom of the polymer film 27 which has been doped by an ion exchange method. The polymer film 27 was formed on a substrate made of glass using PBTTT as a polymeric semiconductor so as to have a thickness of 2 μm. An acetonitrile solution of $F_4TCNQ$ was used as the treatment liquid 40, and the substrate having the polymer film 27 formed thereon was immersed in the treatment liquid 40. The immersion time was 10 seconds. In the measurement, with respect to the top surface of the polymer film 27, incidence of the measurement light and receiving of the scattered light were directly made, and, with respect to the bottom surface, incidence of the measurement light and receiving of the scattered light were made through the substrate.

As apparent from the results of the measurement shown in FIG. 27, the scattered light spectra of the top and bottom of the polymer film 27 have the same peak form, which indicates that the polymer film 27 including the top side and the bottom side is uniformly doped. A diffusion coefficient was determined, and it was found that the diffusion coefficient was on the order of $\mu m^2 s^{-1}$ and even larger than the thermal diffusion coefficient. In the case of subjecting a perchlorate ion ($ClO_4^-$) as a dopant to thermal diffusion using poly(3-hexylthiophene-2,5-diyl) (P3HT) as a polymeric semiconductor, the diffusion coefficient is (1 $nm^2 s^{-1}$).

Example 3

In Example 3, the stability of doping by an ion exchange method was evaluated by observing a change of the color. In a glove box, samples 1 to 4 of the polymer film 27 were individually immersed in the treatment liquid 40 having a salt for cation exchange added to an acetonitrile solution of cobaltocene ($CoCp_2$). As the polymer film 27, a polymer film formed from N2200 was used. The salts added to the treatment liquid 40 are shown in Table 1. After immersed in the treatment liquid 40, the all samples were changed in color from green which indicates the neutral state to red which indicates the doped state. In Table 1, BMIM means 1-butyl-3-methylimidazolium, TBA means tetrabutylammonium, THA means tetraheptylammonium, and TOA means tetraoctylammonium. The samples 1 to 4 which had been immersed in the treatment liquid 40 for a predetermined period of time were removed from the treatment liquid 40 and exposed to air, and, with respect to the resultant samples 1 to 4, a change of the color was observed. The results are shown in Table 1.

TABLE 1

| | Sample | Salt added | Change of color | |
|---|---|---|---|---|
| Example 3 | 1 | BMIM-Cl | After a lapse of 4 minutes: Intermediate color | After a lapse of 16 minutes: Green |
| | 2 | TBA-Br | After a lapse of 4 minutes: Red | After a lapse of 16 minutes: Intermediate color |
| | 3 | THA-Br | After a lapse of 2 minutes: Red | After a lapse of 70 minutes: Nearly green |
| | 4 | TOA-Br | After a lapse of 2 minutes: Red | After a lapse of 70 minutes: Intermediate color |
| Comparative Example | 5 | — | — | Green within one minute |

* Intermediate color: Color between red (doped) and green (neutral state)

As a Comparative Example, using a sample 5 formed from the same polymer film 27 as used in the samples 1 to 4, doping was conducted by immersing the sample 5 in an acetonitrile solution of cobaltocene ($CoCp_2$). With respect to the resultant sample 5, a change of the color was observed in the same manner as in the samples 1 to 4. The results are shown in Table 1.

As is apparent from Table 1, with respect to the sample 5 in the Comparative Example, doping in air is very unstable, whereas, with respect to the samples 1 to 4 which were doped by an ion exchange method, the stability of doping in air is remarkably improved. The improvement is achieved due to the stable closed-shell cation species contained in the polymer film 27.

Example 4

Figure 28:
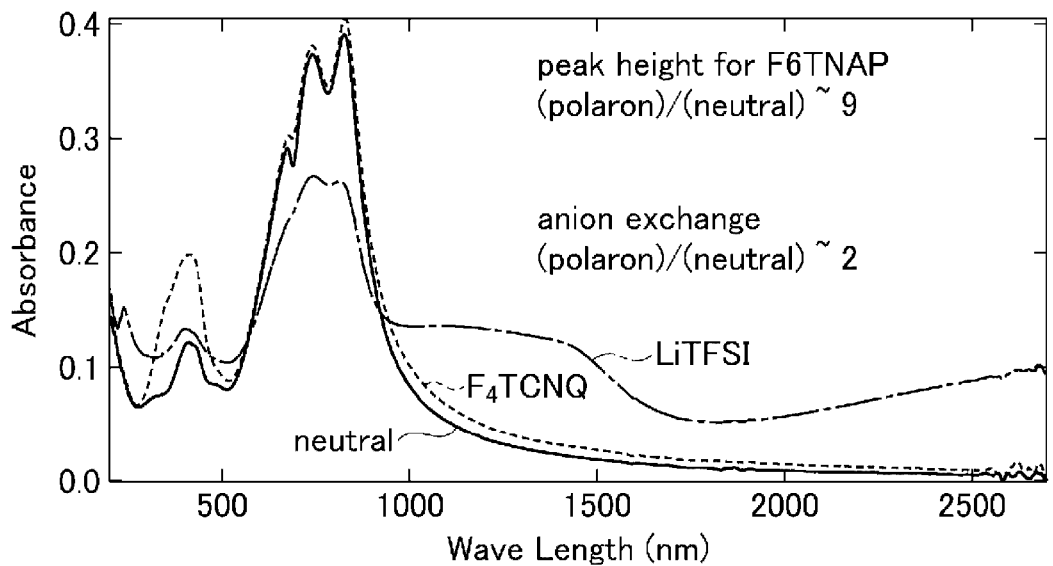
FIG. 28 A graph showing the results of the measurement by ultraviolet-visible-near infrared spectroscopy with respect to the change of PDPP2T-TT-OD by doping.
Figure 29:
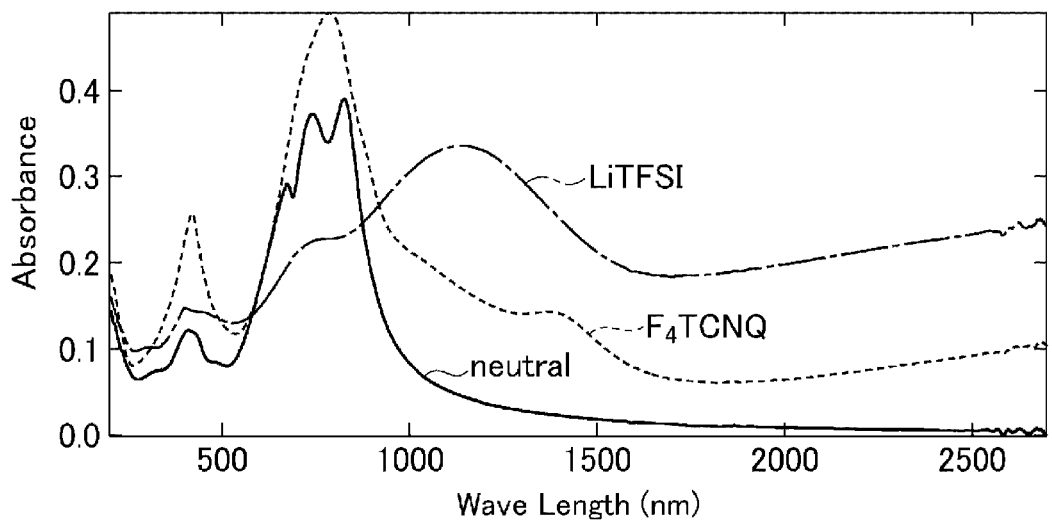
FIG. 29 A graph showing the results of the measurement by ultraviolet-visible-near infrared spectroscopy with respect to the change of PDPP2TT-T by doping.

In Example 4, using ultraviolet-visible-near infrared spectroscopy (UV-Vis-NIR), replacement of the initiator dopant by the alternative ion was examined. FIG. 28 shows light absorption spectra of the polymer film 27 formed from PDPP2T-TT-OD before and after being doped, and FIG. 29 shows light absorption spectra of the polymer film 27 formed from PDPP2TT-T before and after being doped. In FIGS. 28 and 29, the graph indicated by "neutral" shows a light absorption spectrum of the thin film in the neutral state before doped. The graph indicated by "$F_4$TCNQ" shows a light absorption spectrum of the polymer film 27 which has been doped with $F_4$TCNQ. The graph indicated by "LiTFSI" shows a light absorption spectrum of the polymer film which has been doped by an ion exchange method using $F_4$TCNQ as the initiator dopant, a TFSI anion as the alternative ion, and Li as the spectator ion. As apparent from these graphs, after doping by an ion exchange method, the peaks of light absorption spectrum of $F_4$TCNQ that is the initiator dopant disappear, which indicates that $F_4$TCNQ is substantially completely replaced by the TFSI anion that is the alternative ion. Further, in FIG. 28, a change of the spectrum derived from doping, which is not caused in "$F_4$TCNQ", is caused in "LiTFSI", and, from this, it is apparent that the material which cannot be doped using only the initiator dopant can be doped by the ion exchange method. In FIG. 28, with respect to the change of the peak intensity of the polymeric semiconductor in the neutral state, "LiTFSI" is more marked than "$F_4$TCNQ", which indicates that the increase of the doping amount in the ion exchange method is larger than that achieved in the redox method.

Example 5

Figure 30:
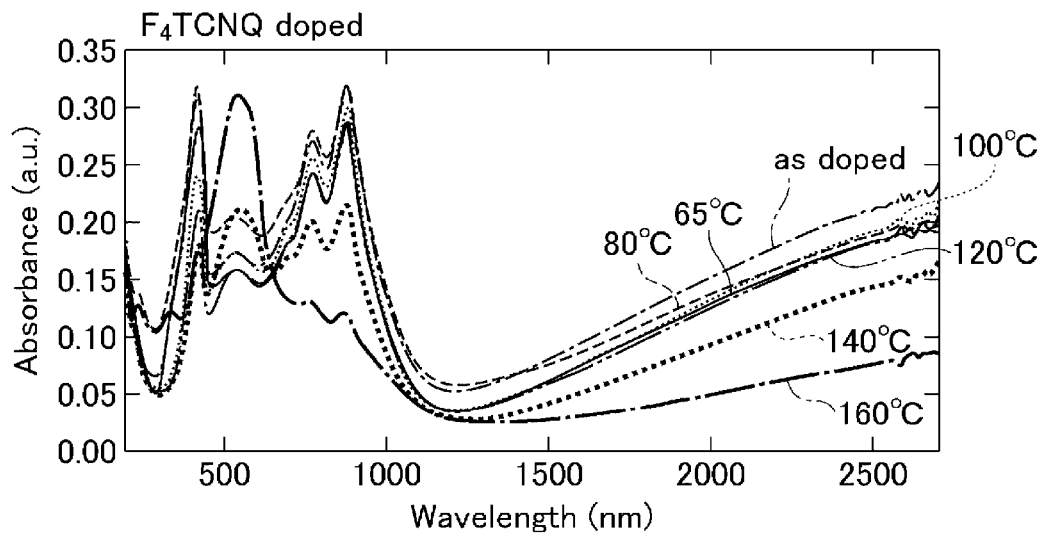
FIG. 30 A graph showing the results of the measurement by ultraviolet-visible-near infrared spectroscopy with respect to the doped polymer film before and after annealing wherein the polymer film is doped by oxidation and reduction.
Figure 31:
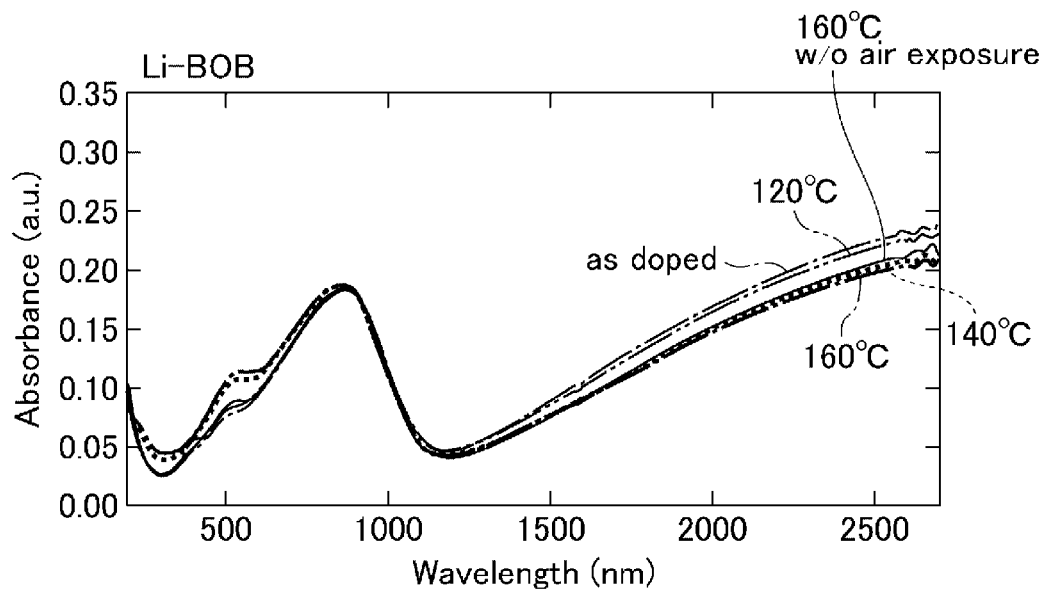
FIG. 31 A graph showing the results of the measurement by ultraviolet-visible-near infrared spectroscopy with respect to the doped polymer film before and after annealing wherein the polymer film is doped by ion exchange using Li-BOB as a salt.

In Example 5, the heat endurance of doping made for the polymer film 27 was examined. In the measurement described below, PBTTT was used as the conductive polymer in each polymer film 27. FIGS. 30 and 31 show light absorption spectra measured using ultraviolet-visible-near infrared spectroscopy with respect to the polymer film 27 which is in the doped state (as doped) before annealing, and the doped polymer film 27 after annealing at the temperatures shown in the figures. FIG. 31 shows the results of the measurement with respect to the polymer film 27 which was doped by a redox method using $F_4$TCNQ as a dopant, and FIG. 31 shows the results of the measurement with respect to the polymer film 27 which was doped using an ion exchange method (salt: Li-BOB).

From FIG. 30, it is found that, in doping with $F_4$TCNQ, the doping amount is markedly reduced at a temperature as high as up to 160° C., that is, the heat endurance is poor. From FIG. 31, it is found that, in the ion exchange method using a BOB anion as the alternative ion, almost no reduction of the doping amount is caused at a temperature as high as up to 160° C., that is, the heat endurance is excellent.

Figure 32:
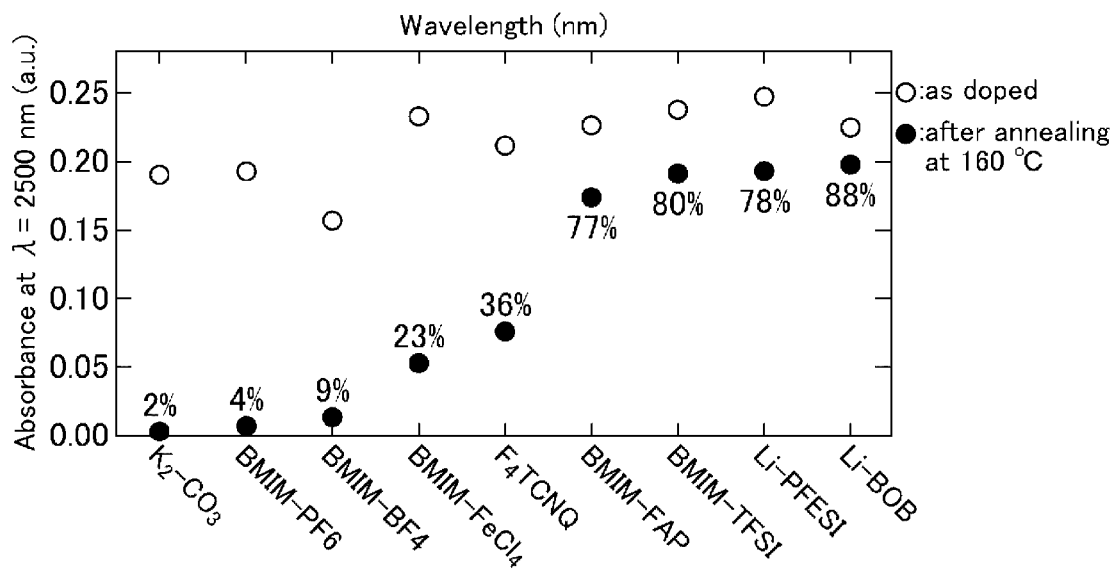
FIG. 32 A graph showing a change of the light absorption intensity at a wavelength of 2,500 nm of the doped polymer film before and after annealing.
Figure 33:
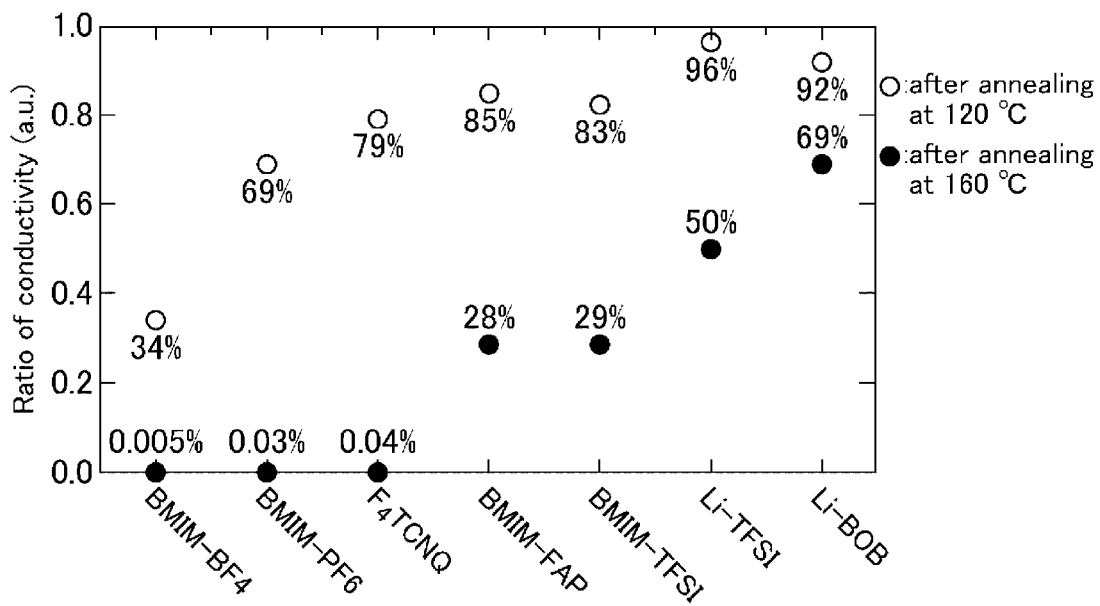
FIG. 33 A graph showing a change of the conductivity of the doped polymer film before and after annealing.
Figure 34:
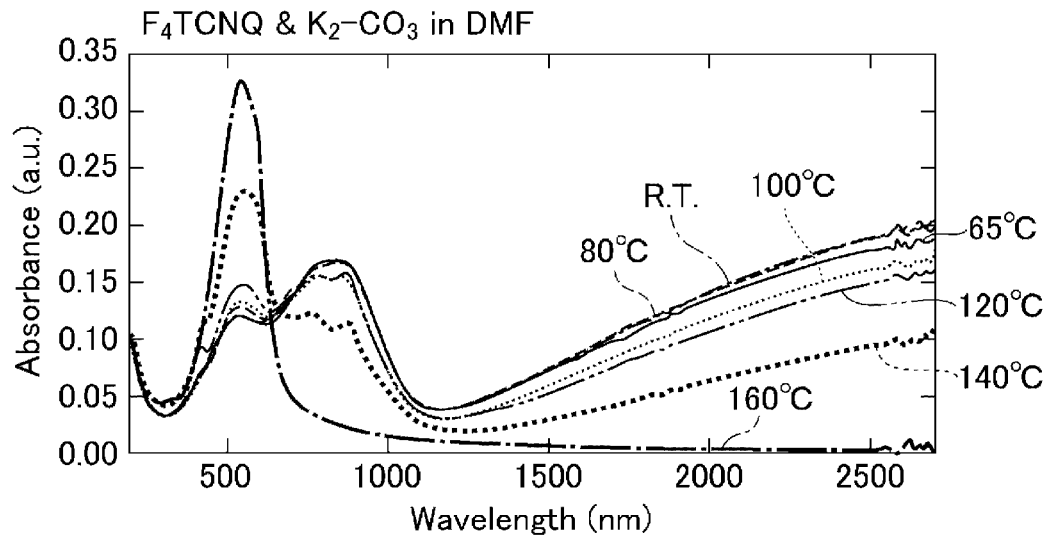
FIG. 34 A graph showing the results of the measurement by ultraviolet-visible-near infrared spectroscopy with respect to the doped polymer film before and after annealing wherein the polymer film is doped by ion exchange using $K_2$—$CO_3$ as a salt.
Figure 35:
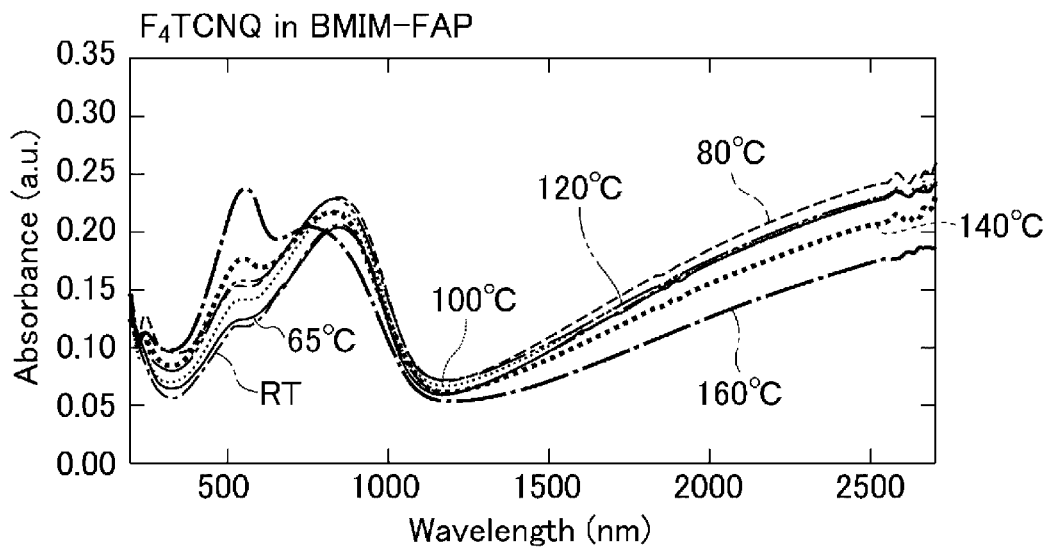
FIG. 35 A graph showing the results of the measurement by ultraviolet-visible-near infrared spectroscopy with respect to the doped polymer film before and after annealing wherein the polymer film is doped by ion exchange using BMIM-FAP as a salt.
Figure 36:
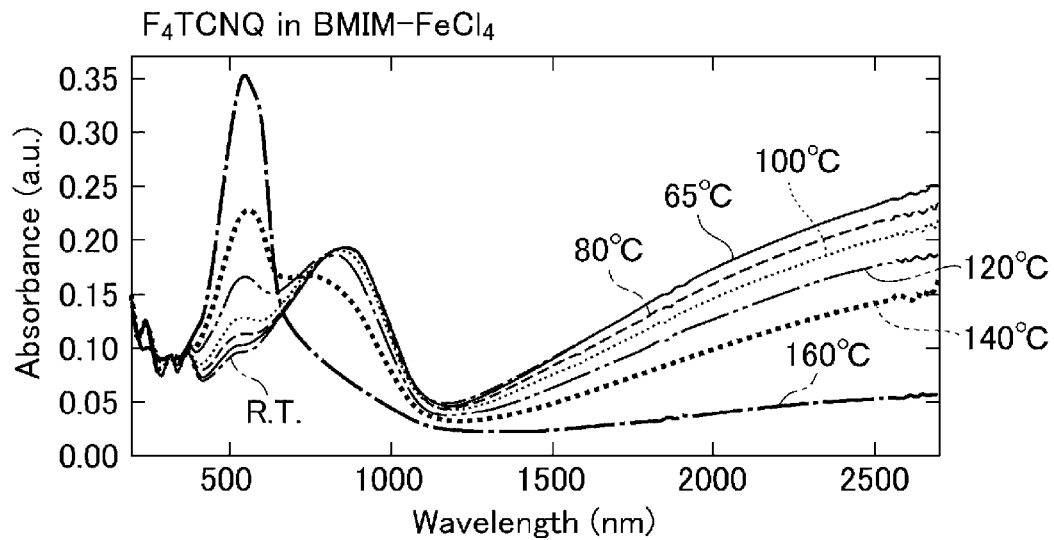
FIG. 36 A graph showing the results of the measurement by ultraviolet-visible-near infrared spectroscopy with respect to the doped polymer film before and after annealing wherein the polymer film is doped by ion exchange using BMIM-FeCl$_4$ as a salt.
Figure 37:
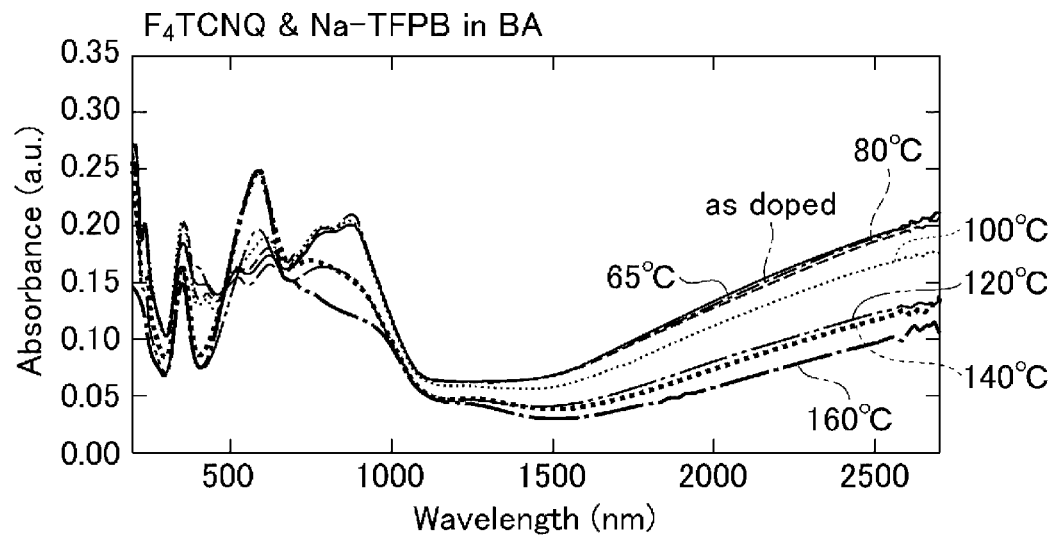
FIG. 37 A graph showing the results of the measurement by ultraviolet-visible-near infrared spectroscopy with respect to the doped polymer film before and after annealing wherein the polymer film is doped by ion exchange using Na-TFPB as a salt.
Figure 38:
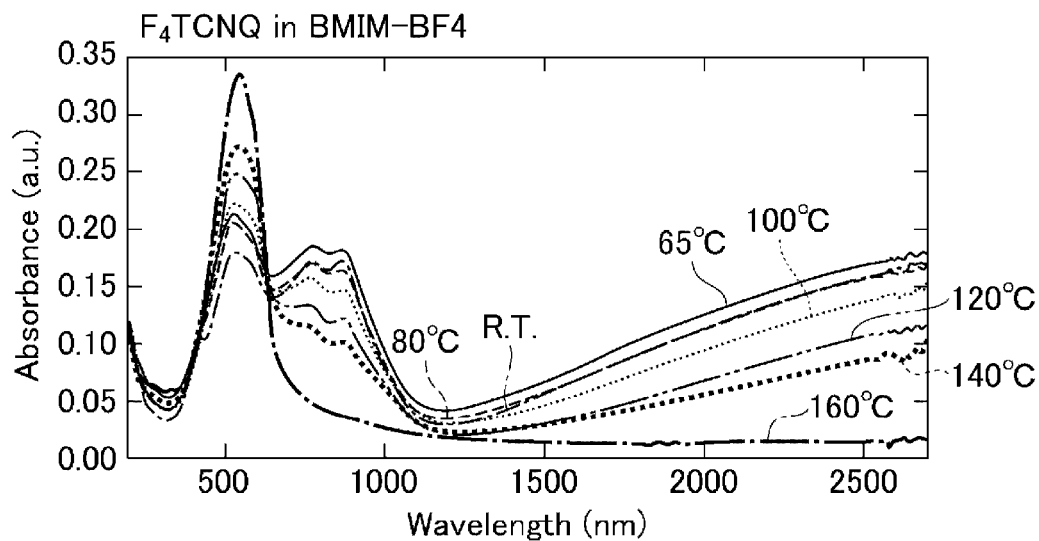
FIG. 38 A graph showing the results of the measurement by ultraviolet-visible-near infrared spectroscopy with respect to the doped polymer film before and after annealing wherein the polymer film is doped by ion exchange using BMIM-BF4 as a salt.
Figure 39:
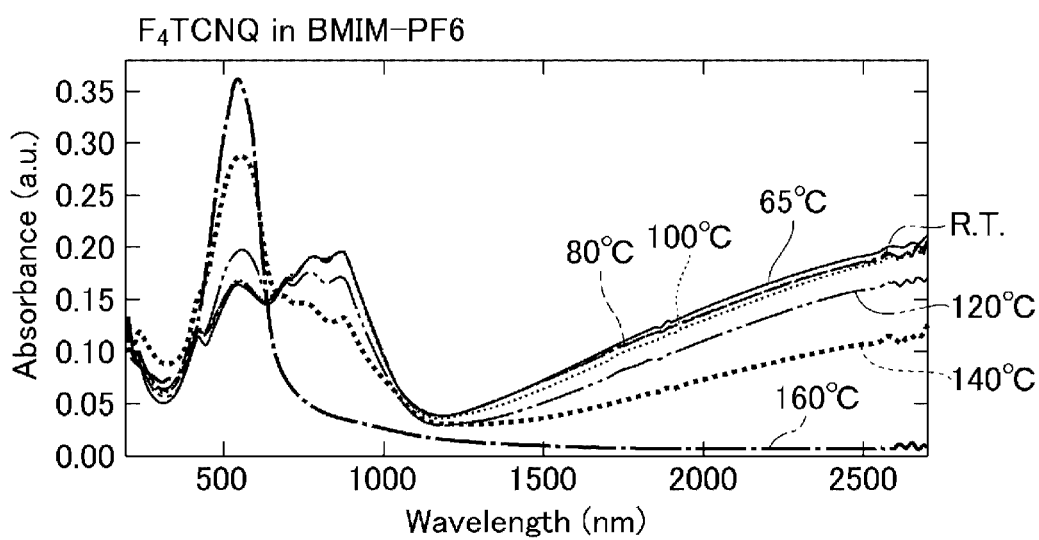
FIG. 39 A graph showing the results of the measurement by ultraviolet-visible-near infrared spectroscopy with respect to the doped polymer film before and after annealing wherein the polymer film is doped by ion exchange using BMIM-PF6 as a salt.
Figure 40:
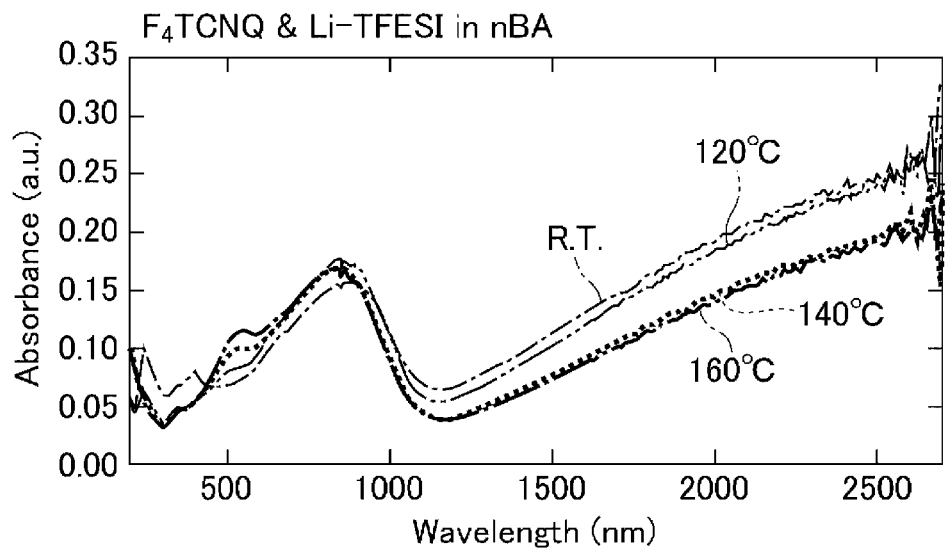
FIG. 40 A graph showing the results of the measurement by ultraviolet-visible-near infrared spectroscopy with respect to the doped polymer film before and after annealing wherein the polymer film is doped by ion exchange using Li-TFESI as a salt.

FIG. 32 shows a change of the light (wavelength: 2,500 nm) absorption intensity of the doped polymer film 27 before and after annealing. The annealing temperature was 160° C. FIG. 33 shows a change of the conductivity of the doped polymer film 27 before and after annealing. The annealing temperature was 120° C. In FIGS. 32 and 33, the indication "$F_4$TCNQ" at the abscissa shows doping by a redox method using $F_4$TCNQ as a dopant. In FIGS. 32 and 33, the indications at the abscissa except "$F_4$TCNQ" show doping by an ion exchange method using the treatment liquid 40 prepared using the respective salts shown at the abscissa.

From FIG. 32, it is found that the heat endurance evaluated by the light absorption spectrum depends on the anion contained. It is found that, when conducting the ion exchange method using a TFSI, PFESI, or BOB anion as the alternative ion, the heat endurance is remarkably improved, especially as compared to that of doping with $F_4$TCNQ. Similarly, with respect to the heat endurance of the conductivity, from FIG. 33, it is found that, when conducting the ion exchange method using a TFSI or BOB anion as the alternative ion, the heat endurance is remarkably improved.

Like the above-mentioned FIGS. 30 and 31, FIGS. 34 to 40 show the results of the measurement of light absorption spectra using ultraviolet-visible-near infrared spectroscopy with respect to the polymer film 27 which is in the doped state using an ion exchange method (as doped, R.T.) before annealing, and the doped polymer film 27 after annealing at the temperatures shown in the figures.

FIGS. 34 to 40 show the results of the measurement with respect to the polymer film 27 which was doped using the treatment liquid 40 having added $F_4$TCNQ as the initiator dopant, and using, as a salt, $K_2$—$CO_3$, BMIM-FAP, BMIM-FeCl$_4$, Na-TFPB, BMIM-BF4, BMIM-PF6, or Li-TFESI. In doping of the polymer film 27 in FIG. 34, the treatment liquid 40 having a salt dissolved in N,N-dimethylformamide (DMF) was used, and, in doping of the polymer film 27 in FIGS. 37 and 40, the treatment liquid 40 having a salt dissolved in butyl acetate (BA) was used.

As compared to the polymer film doped by the redox method shown in FIG. 30, the polymer films 27 doped by the ion exchange method shown in FIGS. 34 to 40 have absorption intensities of $F_4$TCNQ at a wavelength of 767 nm and at a wavelength of 869 nm, which are weaker than those before annealing. This indicates that anion exchange at least partially occurs, so that the amount of $F_4$TCNQ in the polymer film 27 is reduced. Further, it is found that, in the examples of FIGS. 35, 36, and 40 in which no peak is found at a wavelength of 767 nm and at a wavelength of 869 nm, nearly 100% of $F_4$TCNQ is replaced.

From FIGS. 34 to 40, it is found that the absorbance at a wavelength of 2,500 nm used in FIG. 32 is derived from the polymeric semiconductor in the doped state, and this substantiates the fact that the evaluation in FIG. 32 corresponds to evaluation of the heat endurance in the doped state.

Example 6

Figure 41:
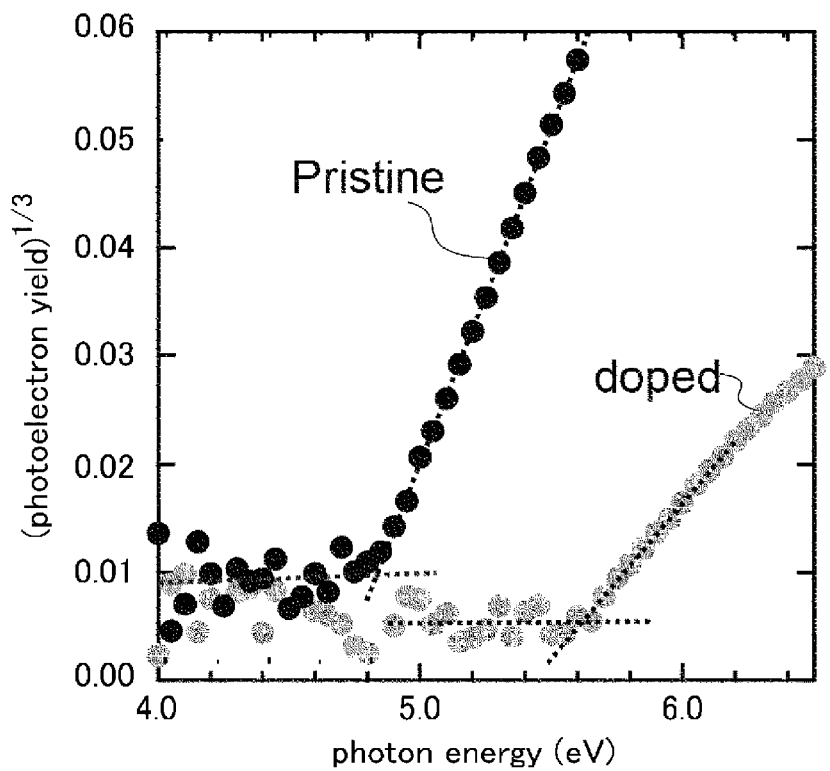
FIG. 41 A graph showing the results of the measurement by photoelectron yield spectroscopy with respect to PBTTT before and after doping by an ion exchange method.

With respect to a polymer film of PBTTT-C14 and a conductive polymer film obtained by doping the polymer film by an ion exchange method, an ionization potential was determined by photoelectron yield spectroscopy. In the doping by an ion exchange method, the treatment liquid 40 having appropriately controlled the concentration and type of the initiator dopant and salt (alternative ion and spectator ion) and the type of the solvent was used. The results of the measurement by photoelectron yield spectroscopy are shown in FIG. 41. In FIG. 41, "Pristine" indicates the graph of the polymer film of PBTTT-C14, and "doped" indicates the graph of the conductive polymer film. As seen from the results of the measurement, the ionization potential of the polymer film of PBTTT-C14 before doped was about 4.8 eV, whereas the ionization potential of the doped conductive polymer film was 5.6 eV or more. The ionization potential of the conductive polymer film evaluated is equivalent to the work function.

PEDOT:PSS used in a conventional organic EL element and the like has a work function of about 5.0 eV, and DNBDT-NW which is considered as a high-mobility organic semiconductor has an ionization potential of 5.24 eV, and the work function of the conductive polymer film is larger than these values. Further, it is apparent that the work function of the conductive polymer film formed as mentioned above is comparable to the work function of polycrystalline platinum (5.6 eV).

Figure 42:
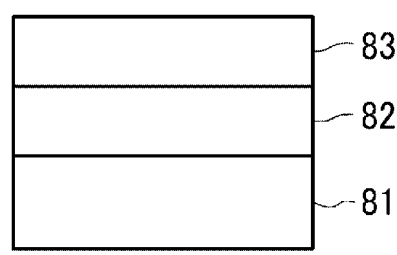
FIG. 42 An explanatory view showing the stacked structure of the conductive polymer film and the organic molecular film, in which storage of charges was confirmed by photoelectron yield spectroscopy.

Subsequently, as shown in FIG. 42, a stacked structure in which an organic molecular film 83 of DNBDT-NW having semiconducting properties is stacked on the surface of a conductive polymer film 82 formed on a plastic substrate 81 was produced. The conductive polymer film 82 had a thickness of 20 nm, and the organic molecular film 83 had a thickness of 10 nm.

Figure 43:
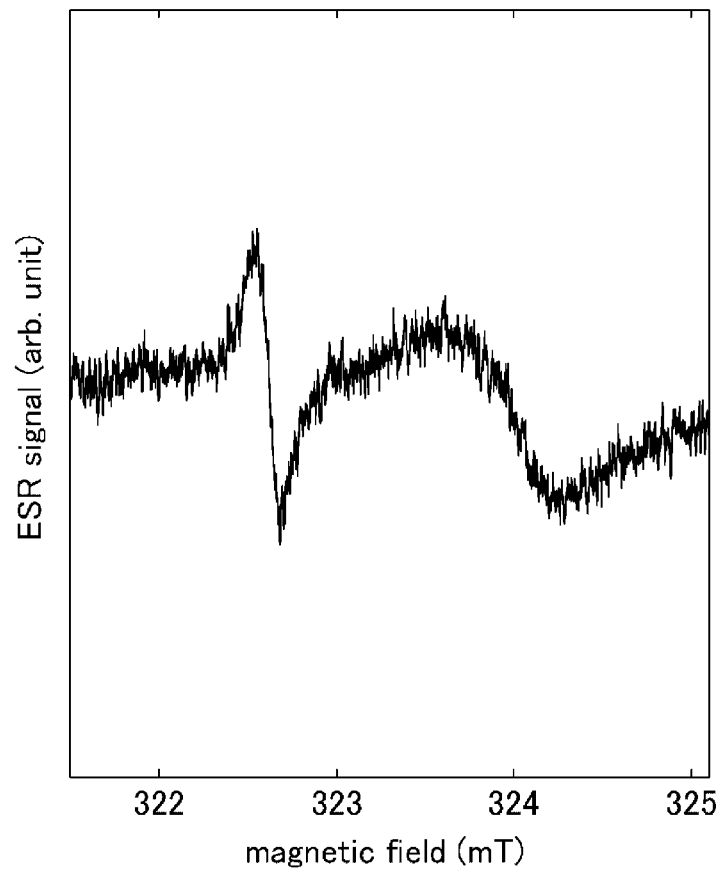
FIG. 43 A graph showing the results of the measurement made using the conductive polymer film obtained by doping a polymer film of PBTTT-C14 by an ion exchange method.
Figure 44:
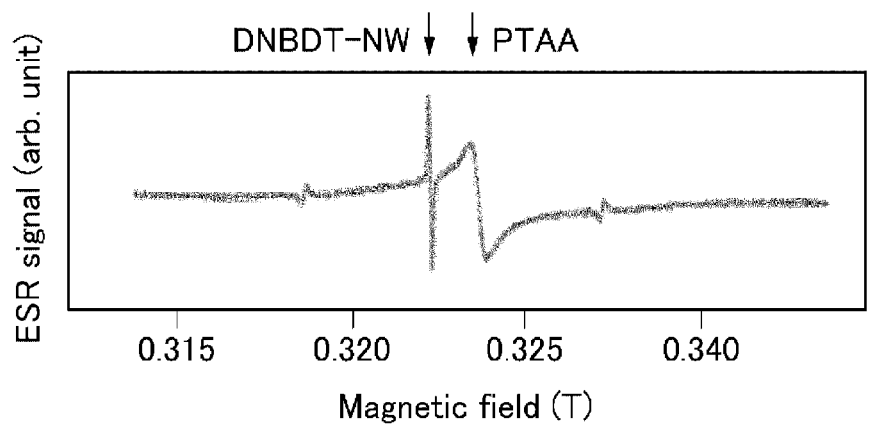
FIG. 44 A graph showing the results of the measurement made using the conductive polymer film obtained by doping a polymer film of PTAA by an ion exchange method.

First, like the case of measurement of a work function, with respect to the case where the conductive polymer film 82 was a conductive polymer film obtained by doping a polymer film of PBTTT-C14 by an ion exchange method, the organic molecular film 83 was subjected to measurement by an electron spin resonance (ESR) method. The results of the measurement (see FIG. 43) show that charges having a spin were stored on the organic molecular film 83. The estimated density of charges injected into the organic molecular film 83 was about $2.5 \times 10^{12}$ cm$^{-2}$. The graph of FIG. 43 shows data measured at 200 K.

Then, with respect to the case where the conductive polymer film 82 was a conductive polymer film obtained by doping a polymer film of poly[bis(4-phenyl)(2,4,6-trimethylphenyl)amine] (PTAA) by an ion exchange method, the organic molecular film 83 was subjected to measurement by an electron spin resonance (ESR) method. Also in this case, the results of the measurement (see FIG. 43) show that charges having a spin were stored on the organic molecular film 83. The estimated density of charges injected into the organic molecular film 83 was about $3 \times 10^{12}$ cm$^2$ at 40 K.

From the above results, it is found that the conductive polymer film (conductive polymer material) is increased in the work function by doping by an ion exchange method, and that carriers are efficiently injected from the conductive polymer film having an increased work function into another conductor or semiconductor material and stored therein.

Example 7

Figure 14:
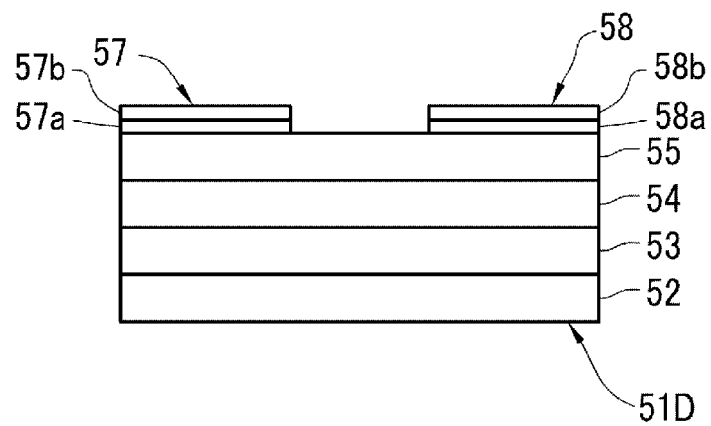
FIG. 14 An explanatory view showing an example in which the drain electrode and source electrode are formed from the conductive polymer layer and the metal layer.

The field effect transistor 51D having the structure shown in FIG. 14 was produced, and properties of the field effect transistor 51D were examined. The actually produced field effect transistor 51D had a structure such that an n-doped silicon substrate was used as the gate electrode 53 and the substrate 52 was omitted.

The insulating layer 54 had a structure in which Parylene is stacked on SiO$_2$. SiO$_2$ had a thickness of 100 nm, and Parylene had a thickness of 50 nm. The semiconductor layer 55 was an organic molecular film of DNBDT-NW, and had a thickness of 10 nm. The drain electrode 57 had a two-layer structure of the conductive polymer layer 57a and the metal layer 57b, and the source electrode 58 had a two-layer structure of the conductive polymer layer 58a and the metal layer 58b. The conductive polymer layers 57a, 58a were individually a conductive polymer film obtained by doping a polymer film of PBTTT-C14 by an ion exchange method. The metal layers 57b, 58b were individually formed from gold (Au). The conductive polymer layers 57a, 58a individually had a thickness of 20 nm, and the metal layers 57b, 58b individually had a thickness of 30 nm. The field effect transistor 51D had a channel length of 170 μm and a channel width of 1 mm.

Figure 45:
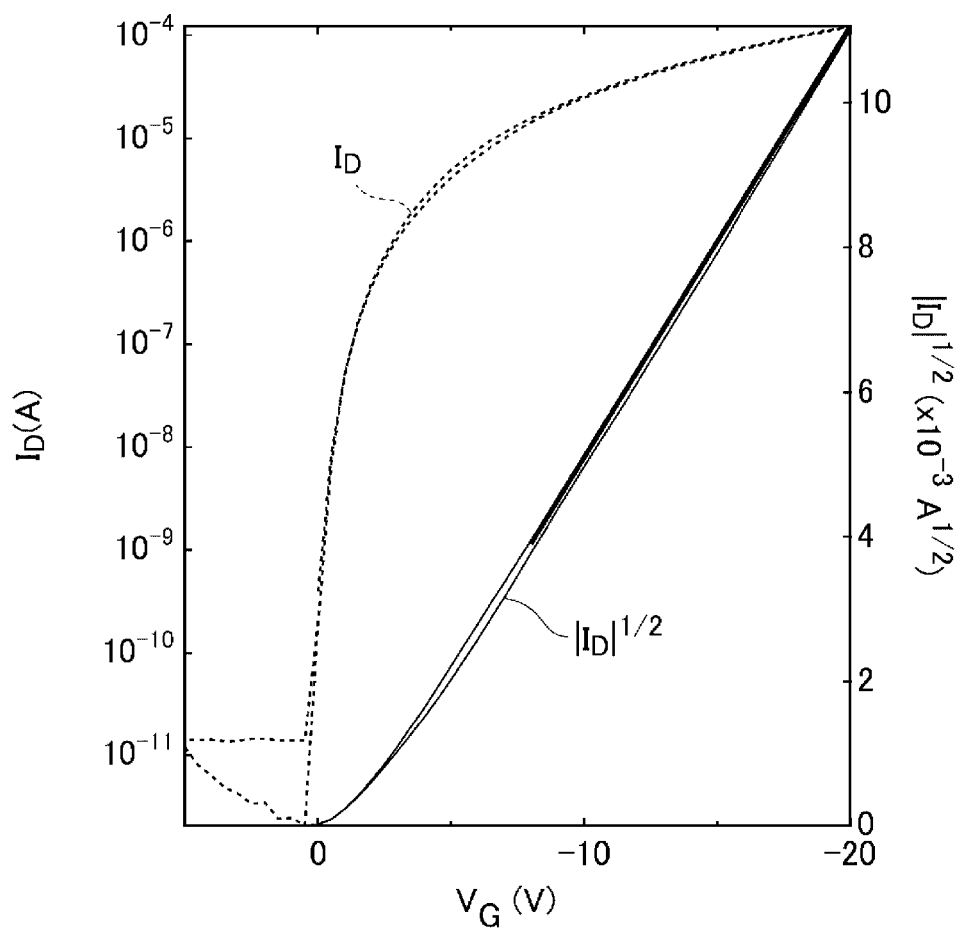
FIG. 45 A graph showing the results of the measurement of properties with respect to the field effect transistor in which the drain electrode and source electrode are formed from the conductive polymer layer and the metal layer.

With respect to the field effect transistor 51D produced as mentioned above, properties in the saturation region at a drain voltage of −20 V (change of the drain current $I_D$ with the gate voltage $V_G$) were measured. From the results of the measurement (see FIG. 45), it was found that the field effect transistor 51D had a mobility of 5 cm$^2$/Vs, and that efficient injection of carriers was caused at the interface between the conductive polymer layers 57a, 58a having a high work function and the semiconductor layer 55, achieving high mobility.

Then, the field effect transistor 51 having the structure shown in FIG. 9 was produced, and properties of the field effect transistor 51 were examined in the same manner as mentioned above. The field effect transistor 51 also had a structure such that an n-doped silicon substrate was used as the gate electrode 53 and the substrate 52 was omitted.

The insulating layer 54 had a structure in which Parylene is stacked on SiO$_2$, and SiO$_2$ had a thickness of 100 nm and Parylene had a thickness of 25 nm. The semiconductor layer 55 was an organic molecular film of DNBDT-NW having a thickness of 10 nm. The drain electrode 57 was formed from only one layer of the conductive polymer layer 57a, and the source electrode 58 was formed from only one layer of the conductive polymer layer 58a, and the conductive polymer layers 57a, 58a were individually a conductive polymer film obtained by doping a polymer film of PBTTT-C14 by an ion exchange method. The conductive polymer layers 57a, 58a individually had a thickness of 150 nm. The field effect transistor 51 had a channel length of 60 μm and a channel width of 1 mm.

Figure 46:
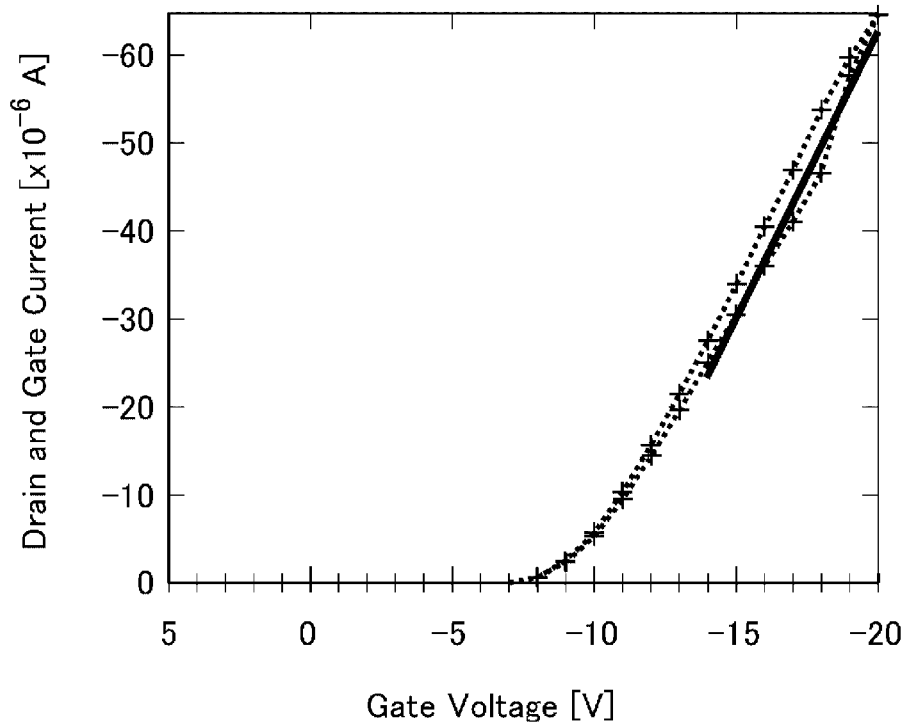
FIG. 46 A graph showing the results of the measurement of properties with respect to the field effect transistor in which the drain electrode and source electrode are formed from only one layer of the conductive polymer layer.

With respect to the field effect transistor 51 produced as mentioned above, properties in the saturation region at a drain voltage of −3 V were measured. From the results of the measurement (see FIG. 46), it was found that the field effect transistor 51 had a mobility of 6.3 cm$^2$/Vs, and that efficient injection of carriers was caused at the interface between the conductive polymer layers 57a, 58a having a high work function and the semiconductor layer 55, achieving high mobility. Further, it was found that the conductive polymer layers 57a, 58a had a high conductivity and hence, even when the source and drain electrodes were formed from only the conductive polymer layers 57a, 58a, the field effect transistor 51 appropriately operated.

Example 8

Figure 47:
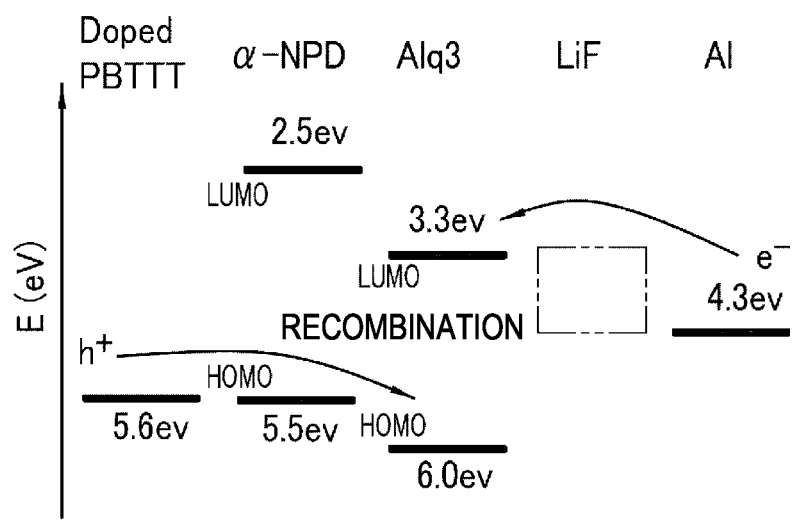
FIG. 47 A graph showing the energy level in the stacked structure of the organic EL element produced in Example 8.

The organic EL element 61 having the structure shown in FIG. 15 was produced. A glass plate was used as the transparent substrate 62. The anode 63 was formed from an ITO thin film. The conductive polymer layer 64 was a conductive polymer film obtained by doping a polymer film of PBTTT-C14 by an ion exchange method, and had a thickness of 30 nm. The hole transport layer 65 was a thin film of α-NPD having a thickness of 40 nm, and the light emitting layer 66 was a thin film of Alq3 having a thickness of 70 nm. The electron transport layer 67 was a thin film of LiF having a thickness of 2 nm, and the cathode 68 was a thin film of aluminum having a thickness of 30 nm. The energy level of the organic EL element 61 having such a stacked structure is shown in FIG. 47. LiF is generally used in an organic EL element, but the mechanism of the injection of electrons in LiF has not been completely elucidated. For this reason, in FIG. 47, the energy level of LiF is drawn with a double dot-dash line for convenience sake.

Figure 48:
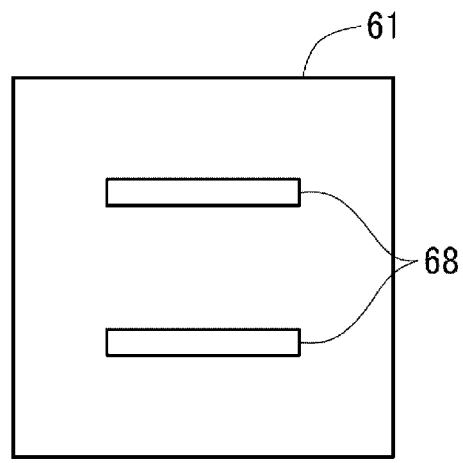
FIG. 48 A plan view showing a cathode formed on the upper surface of the organic EL element produced in Example 8.

In the production of the organic EL element 61, the hole transport layer 65 and the light emitting layer 66 were successively formed by depositing α-NPD on the entire surface of one surface of the conductive polymer layer 64, and then further depositing Alq3 on the entire surface. Subsequently, using a mask, LiF and aluminum were successively deposited on one surface of the light emitting layer 66, thus forming, as shown in FIG. 48, two straight lines of cathodes 68 on the upper surface of the organic EL element 61 (the surface on the side opposite to the transparent substrate 62).

Figure 49:
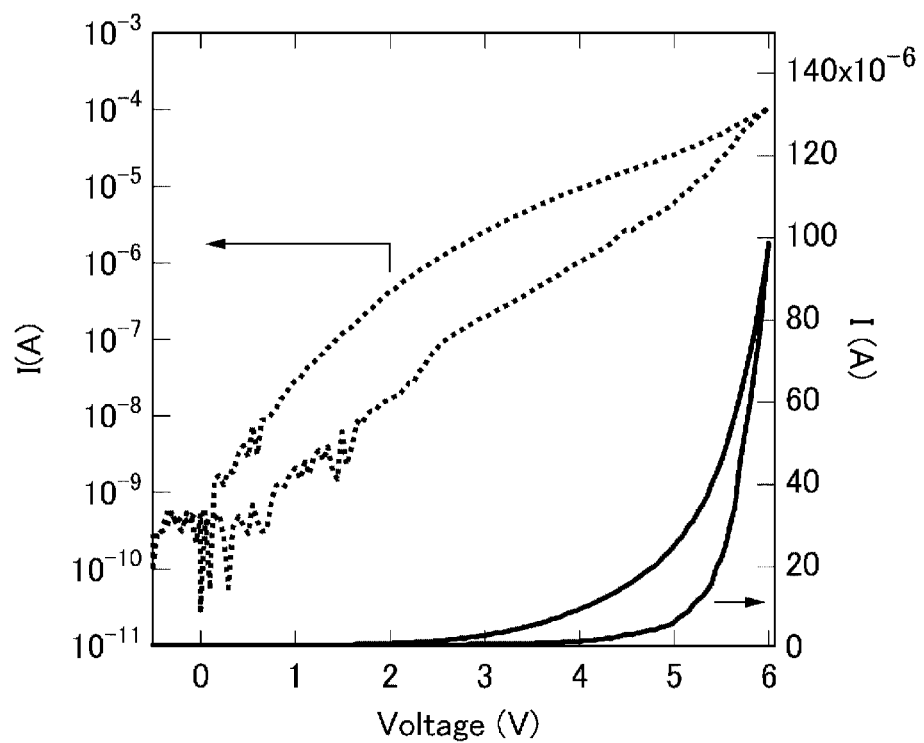
FIG. 49 A graph showing the relationship between the forward voltage and the current with respect to the organic EL element produced in Example 8.

When a predetermined forward voltage was applied between the anode 63 and each cathode 68 of the produced organic EL element 61, light emission in a form corresponding to the two cathodes 68 was seen from the transparent substrate 62 side. The results of the measurement of a current flowing the organic EL element 61 in relation to the applied forward voltage are shown in FIG. 49. In the graph of FIG. 49, the abscissa indicates a voltage applied in the forward direction, and the ordinate indicates a value of a current flowing the organic EL element 61. A value of current is plotted in a linear system (graph drawn by a solid line) and is also plotted in a logarithmic system (graph drawn by a dotted line), and the right-hand ordinate corresponds to the linear system and the left-hand ordinate corresponds to the logarithmic system.

Figure 18:
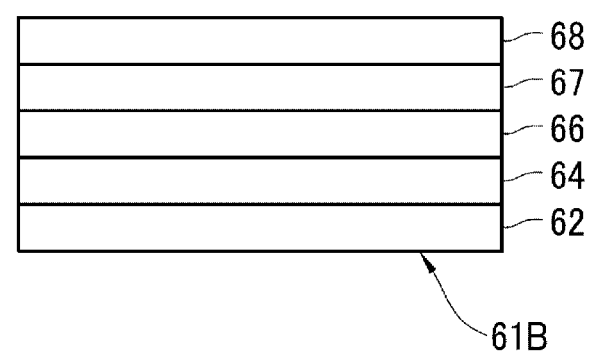
FIG. 18 An explanatory view showing the construction of an example of the organic EL element in which only one layer of the conductive polymer layer constitutes a buffer layer on the hole transport side.

Further, the organic EL element 61B having the structure shown in FIG. 18 was produced. The transparent substrate 62, conductive polymer layer 64, light emitting layer 66, electron transport layer 67, and cathode 68 constituting the organic EL element 61B were formed from the same materials as those for the above-mentioned organic EL element 61. With respect to the electron transport layer 67 and cathode 68, using a mask, LiF and aluminum were successively deposited on one surface of the light emitting layer 66 in the same manner as in the production of the organic EL element 61, forming two straight lines of cathodes 68.

Figure 50:
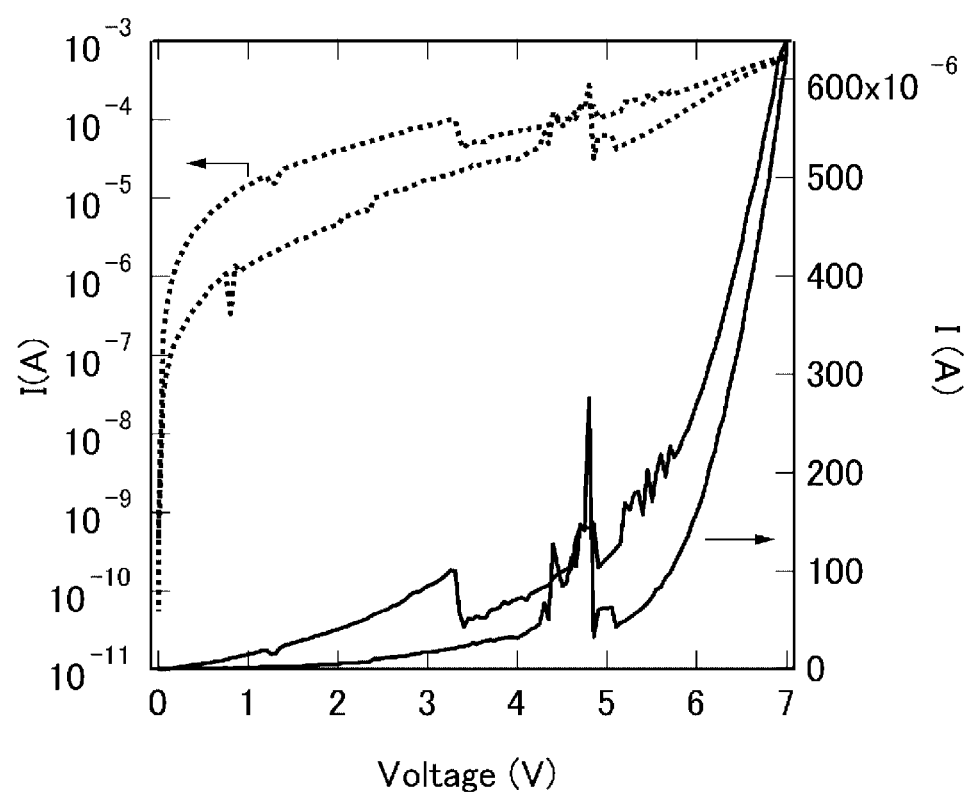
FIG. 50 A graph showing the relationship between the forward voltage and the current with respect to the organic EL element in which only one layer of the conductive polymer layer constitutes a buffer layer on the hole transport side.

When a predetermined forward voltage was applied between the anode 63 and the cathode 68 of the produced organic EL element 61B, light emission in a form corresponding to the two cathodes 68 was seen from the transparent substrate 62 side. The results of the measurement of a current flowing the organic EL element 61 in relation to the applied forward voltage are shown in FIG. 50. In FIG. 50, a voltage applied in the forward direction and a value of a current flowing the organic EL element 61B are plotted in the same manner as in the above-mentioned FIG. 49.

REFERENCE SIGNS LIST

10: Thermoelectric conversion element
12, 13: Conductive polymer film
23: Solution
23A: Solution film
27: Polymer film
28: Polymeric semiconductor
35: Dopant
40: Treatment liquid
51, 51 to 51D: Field effect transistor
57a, 58a, 64, 74: Conductive polymer layer
57b, 58b: Metal layer
61, 61A to &1D: Organic EL element
71, 71A to 71D: Photovoltaic element

The invention claimed is:

1. A method for producing an electrically conductive polymer material comprising:
    a preparing step of providing a polymer film formed from an oriented polymeric semiconductor; and
    a doping step of introducing a first ion into the polymer film, in the doping step, a treatment liquid, which is obtained by dissolving, in an ionic liquid including the first ion having an opposite polarity to carriers to be injected into the polymeric semiconductor by doping in a form of at least one of a cation and an anion, or in an organic solvent having dissolved therein a salt including the first ion, a dopant which has a same polarity as that of the first ion and which oxidizes or reduces the polymeric semiconductor, is allowed to be in contact with a surface of the polymer film to form an intermediate of a second ion formed by ionization of the dopant and the polymeric semiconductor by a redox reaction, and to replace the second ion in the intermediate with the first ion.

2. The method for producing an electrically conductive polymer material according to claim 1, wherein, in the preparing step, a solution having the polymeric semiconductor dissolved in a solvent is supplied onto a surface of a flat substrate, and the solution on the substrate is pressed by a flat plane into a film form, and the solvent in the solution is evaporated in a state of being pressed thereby the polymer film formed from the polymeric semiconductor is obtained.

3. An electrically conductive polymer material comprising:
    a polymer film formed from polymeric semiconductors which are oriented in an orientation direction and in a form of a plurality of layers stacked on one another in a stacking direction; and
    a dopant distributed in the polymer film in the stacking direction of the stacked layers of the polymeric semiconductors,
        wherein an amount of the dopant contained in each of the polymeric semiconductors is in the range of from ⅓ to 2 dopant per one space between a pair of side chains adjacent to each other in the orientation direction of the polymeric semiconductors.

4. The electrically conductive polymer material according to claim 3, wherein the polymer film has a thickness in a range of from at least 30 nm to 50 μm.

* * * * *